US011973074B2

United States Patent
Yu et al.

(10) Patent No.: US 11,973,074 B2
(45) Date of Patent: *Apr. 30, 2024

(54) PHOTONIC SEMICONDUCTOR DEVICE AND METHOD OF MANUFACTURE

(71) Applicant: Taiwan Semiconductor Manufacturing Co., Ltd., Hsinchu (TW)

(72) Inventors: Chen-Hua Yu, Hsinchu (TW); Hsing-Kuo Hsia, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/818,799

(22) Filed: Aug. 10, 2022

(65) Prior Publication Data

US 2022/0392881 A1  Dec. 8, 2022

Related U.S. Application Data

(62) Division of application No. 16/929,872, filed on Jul. 15, 2020.

(Continued)

(51) Int. Cl.
*H01L 25/16* (2023.01)
*G02B 6/122* (2006.01)
(Continued)

(52) U.S. Cl.
CPC ............ *H01L 25/167* (2013.01); *G02B 6/122* (2013.01); *G02B 6/13* (2013.01);
(Continued)

(58) Field of Classification Search
CPC . H01L 25/167; H01L 25/50; H01L 31/02002; H01L 31/02325; H01L 31/18;
(Continued)

(56) References Cited

U.S. PATENT DOCUMENTS

2013/0330033 A1  12/2013  Yu et al.
2014/0376857 A1*  12/2014  Chantre ............... H01S 5/1032
                                                        438/31

(Continued)

FOREIGN PATENT DOCUMENTS

JP         2015216169 A      12/2015
KR         101843241 B1       3/2018
(Continued)

*Primary Examiner* — Calvin Y Choi
(74) *Attorney, Agent, or Firm* — Slater Matsil, LLP

(57) ABSTRACT

A package includes an interposer structure including a first via; a first interconnect device including conductive routing and which is free of active devices; an encapsulant surrounding the first via and the first interconnect device; and a first interconnect structure over the encapsulant and connected to the first via and the first interconnect device; a first semiconductor die bonded to the first interconnect structure and electrically connected to the first interconnect device; and a first photonic package bonded to the first interconnect structure and electrically connected to the first semiconductor die through the first interconnect device, wherein the first photonic package includes a photonic routing structure including a waveguide on a substrate; a second interconnect structure over the photonic routing structure, the second interconnect structure including conductive features and dielectric layers; and an electronic die bonded to and electrically connected to the second interconnect structure.

20 Claims, 22 Drawing Sheets

Related U.S. Application Data

(60) Provisional application No. 62/902,602, filed on Sep. 19, 2019.

(51) Int. Cl.
*G02B 6/13* (2006.01)
*H01L 31/02* (2006.01)
*H01L 31/0232* (2014.01)
*H01L 31/18* (2006.01)

(52) U.S. Cl.
CPC .. *H01L 31/02002* (2013.01); *H01L 31/02325* (2013.01); *H01L 31/18* (2013.01)

(58) Field of Classification Search
CPC ............... H01L 31/02327; H01L 31/04; H01L 23/5384; H01L 23/5383; H01L 23/5389; H01L 23/13; H01L 23/31; H01L 23/481; H01L 23/49838; H01L 23/525; H01L 23/528; H01L 24/97; G02B 6/122; G02B 6/13; G02B 6/4214; G02B 6/12004; G02B 6/136; G02B 6/30; G02B 2006/12061; Y02E 10/50

USPC ........................................................ 257/431

See application file for complete search history.

(56) References Cited

U.S. PATENT DOCUMENTS

| | | |
|---|---|---|
| 2015/0323738 A1 | 11/2015 | Sekiguchi et al. |
| 2017/0084590 A1 | 3/2017 | Yu et al. |
| 2017/0131469 A1 | 5/2017 | Kobrinsky et al. |
| 2018/0275359 A1 | 9/2018 | Ding et al. |
| 2019/0146166 A1 | 5/2019 | Wang et al. |
| 2019/0148329 A1 | 5/2019 | Ting et al. |
| 2019/0162901 A1 | 5/2019 | Yu et al. |

FOREIGN PATENT DOCUMENTS

| | | |
|---|---|---|
| KR | 20190055683 A | 5/2019 |
| KR | 20190064388 A | 6/2019 |
| TW | 201911503 A | 3/2019 |

* cited by examiner

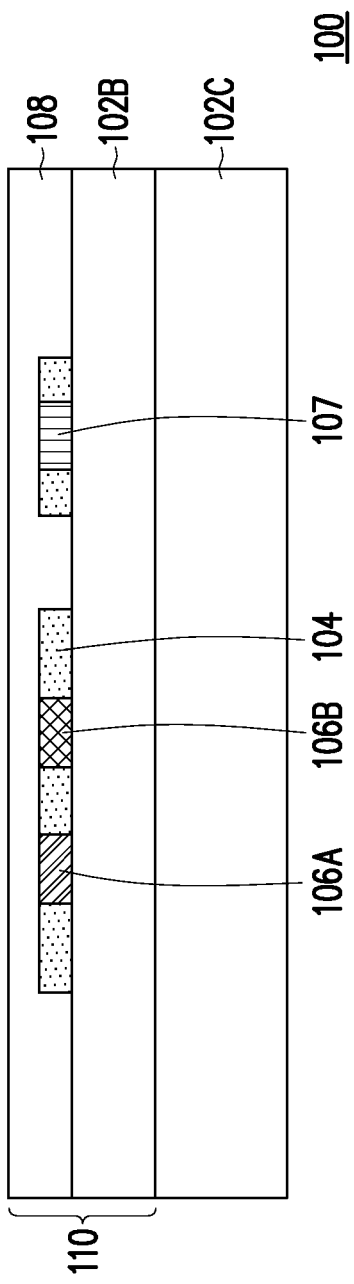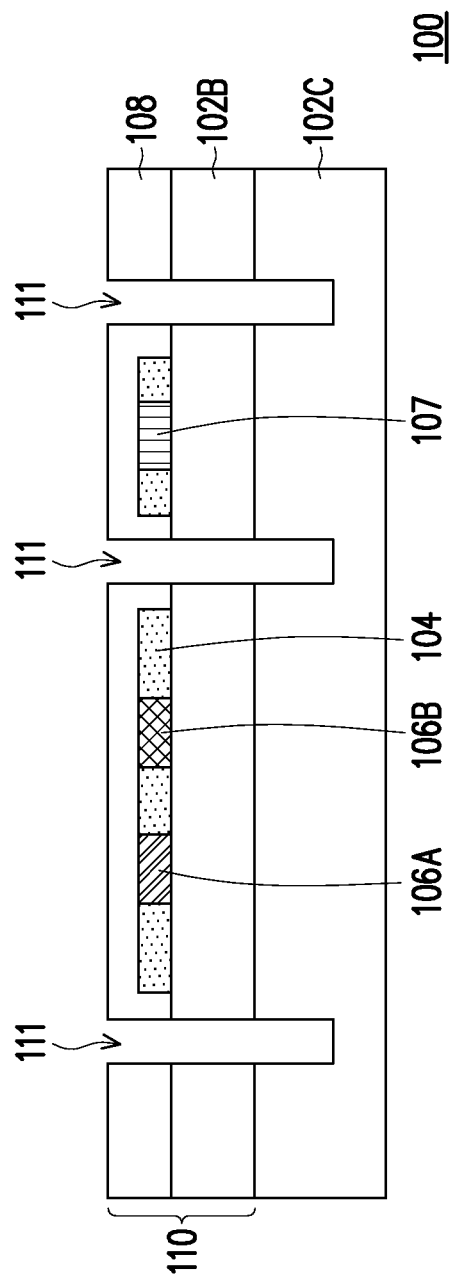

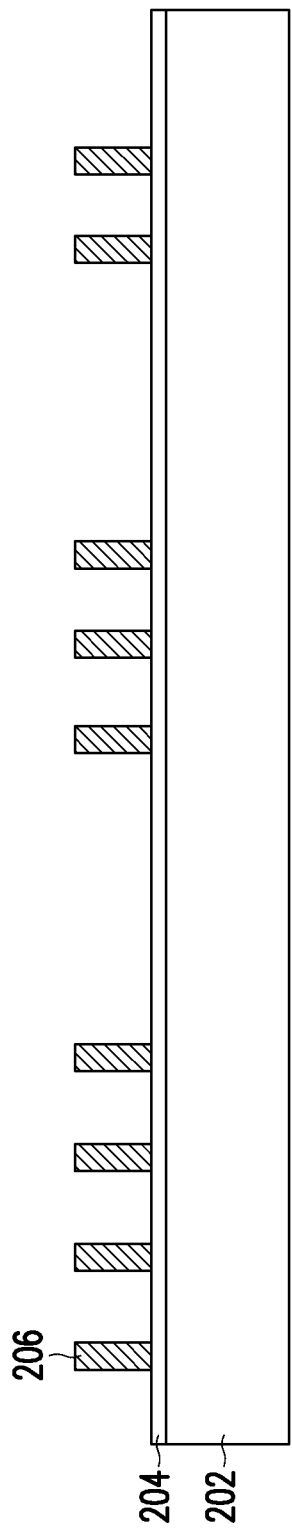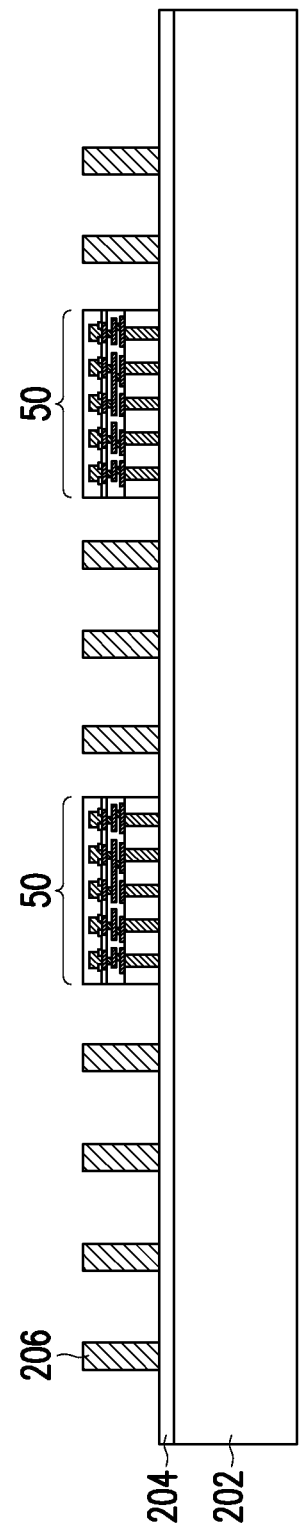

PHOTONIC SEMICONDUCTOR DEVICE AND METHOD OF MANUFACTURE

PRIORITY CLAIM AND CROSS-REFERENCE

This application is a divisional of U.S. patent application Ser. No. 16/929,872, filed on Jul. 15, 2020, and entitled "Photonic Semiconductor Device and Method of Manufacture," which claims the benefits of U.S. Provisional Application No. 62/902,602, filed on Sep. 19, 2019, which applications are hereby incorporated herein by reference in its entirety.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 11 illustrate cross-sectional views of intermediate steps of forming a photonic package, in accordance with some embodiments.

FIGS. 14 through 22 illustrate cross-sectional views of intermediate steps of forming an interposer structure, in accordance with some embodiments.

DETAILED DESCRIPTION

Figure 1:
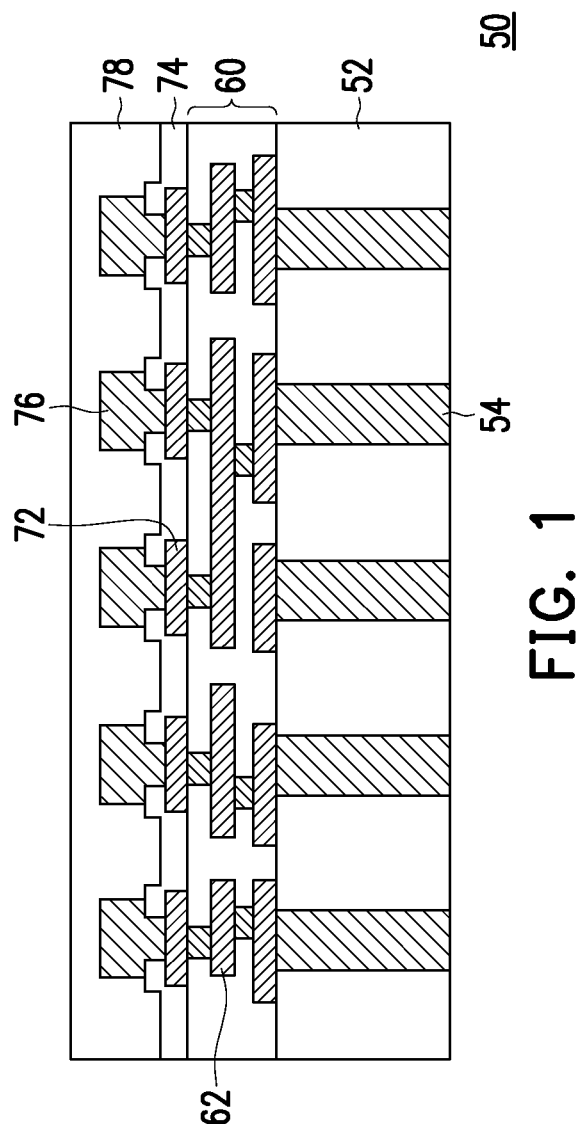
FIG. 1 illustrates a cross-sectional view of an interconnect device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package and the formation thereof are described. Three-dimensional (3D) packages including both optical devices and electrical devices, and the method of forming the same are provided, in accordance with some embodiments. In particular, electronic dies are formed over a waveguide structure that provide an interface between electrical signals sent or received from a processing device and optical signals sent or received from an optical fiber or optical waveguide network. The electronic dies and the processing device are attached to an interposer structure that facilitates transmission of electrical signals between the electronic dies and the processing device. The interposer structure may be formed of a composite material or a molding compound, and may include embedded interconnect devices that allow for improved high-speed transmission of electrical signals. The intermediate stages of forming the packages are illustrated, in accordance with some embodiments. Some variations of some embodiments are discussed. Throughout the various views and illustrative embodiments, like reference numbers are used to designate like elements.

FIG. 1 illustrates a cross-sectional view of an interconnect device 50, in accordance with some embodiments. The interconnect device 50 will be incorporated into an interposer structure 250 (see FIG. 22) in subsequent processing to form a photonic system 300 (see FIG. 24). The interconnect device 50 provides electrical connection between devices attached to the interposer structure 250 in the photonic system 300, such as between a photonic package 100 and a processing die 324 and/or a memory die 326 (see FIG. 24). In some embodiments, the interconnect device 50 includes through-substrate vias (TSVs) 54 to make electrical connections between conductive features on opposite sides of the interconnect device 50. The TSVs 54 of the interconnect device 50 are optional, and may not be present in some embodiments. The interconnect device 50 may be formed using applicable manufacturing processes. The interconnect device 50 may be free of active devices and/or free of passive devices. In some embodiments, the interconnect device 50 may have a thickness that is between about 100 μm and about 500 μm. In some embodiments, an interconnect device 50 may have lateral dimensions between about 2 mm by 4 mm and about 12 mm by 25 mm, such as about 3 mm by 20 mm.

Still referring to FIG. 1, the interconnect device 50 may include a first interconnect structure 60 formed on a substrate 52. The substrate 52 may be, for example, a glass substrate, a ceramic substrate, a semiconductor substrate, or the like. In some embodiments, the substrate 52 may be a silicon wafer or an active layer of a semiconductor-on-insulator (SOI) substrate, or the like. The substrate 52 may include a semiconductor material, such as doped or undoped silicon, or may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In some embodiments, multiple interconnect devices 50 may be formed on a single substrate 52 and singulated in to form individual interconnect devices 50, such as the individual interconnect device 50 shown in FIG. 1. The substrate 52 may be referred to as having a front side or front surface (e.g., the side facing upwards in FIG. 1), and a back side or back surface (e.g., the side facing downwards in FIG. 1).

In some embodiments, the interconnect device 50 comprises one or more layers of electrical routing 62 (e.g., redistribution layers (RDLs), metallization patterns or layers, conductive lines, and vias, or the like) in a first interconnect structure 60 formed over the substrate 52. The electrical routing 62 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like).

In some embodiments, the electrical routing 62 is formed using a damascene process in which a respective dielectric layer is patterned and etched utilizing photolithography techniques to form trenches corresponding to the desired pattern of metallization layers and/or vias. An optional diffusion barrier and/or optional adhesion layer may be deposited and the trenches may be filled with a conductive material. Suitable materials for the barrier layer includes titanium, titanium nitride, tantalum, tantalum nitride, or other alternatives, and suitable materials for the conductive material include copper, silver, gold, tungsten, aluminum, combinations thereof, or the like. In an embodiment, the metallization layers may be formed by depositing a seed layer of copper or a copper alloy, and filling the trenches by electroplating. A chemical mechanical planarization (CMP) process or the like may be used to remove excess conductive material from a surface of the respective dielectric layer and to planarize the surface for subsequent processing.

In some embodiments, the use of a damascene or dual damascene process can form electrical routing 62 having a smaller pitch (e.g., "fine-pitch routing"), which can increase the density of the electrical routing 62 and also may allow for improved conduction and connection reliability within the interconnect device 50. In some cases, during high-speed operation (e.g., greater than about 2 Gbit/second), electrical signals may be conducted near the surfaces of conductive components. Fine-pitch routing may have less surface roughness than other types of routing, and thus can reduce resistance experienced by higher-speed signals and also reduce signal loss (e.g. insertion loss) during high-speed operation. This can improve the performance of high-speed operation, for example, of Serializer/Deserializer ("SerDes") circuits or other circuits that may be operated at higher speeds.

In some embodiments, the interconnect device 50 further includes pads 72, such as aluminum pads, to which external connections are made. The pads 72 may be formed on the first interconnect structure 60 and electrically connected to the electrical routing 62. In some embodiments, one or more passivation films 74 are formed on portions of the first interconnect structure 60 and the pads 72. Openings extend through the passivation films 74 to the pads 72, and conductive connectors 76 extend through the openings in the passivation films 74 to contact the pads 72.

In some embodiments, the conductive connectors 76 comprise metal pads or metal pillars (such as copper pillars). The conductive connectors 76 may include a conductive material such as solder, copper, aluminum, gold, nickel, silver, palladium, tin, the like, or a combination thereof. In some embodiments, the metal pillars may be solder-free and/or have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, the conductive connectors 76 are formed using a plating process.

A dielectric layer 78 may (or may not) be formed on the interconnect device 50, such as on the passivation films 74 and the conductive connectors 76. The dielectric layer 78 may laterally encapsulate the conductive connectors 76, and the dielectric layer 78 may be laterally coterminous with the interconnect device 50. Initially, the dielectric layer 78 may bury the conductive connectors 76, such that the topmost surface of the dielectric layer 78 is above the topmost surfaces of the conductive connectors 76, as shown in FIG. 1. In some embodiments in which a solder material is disposed on the conductive connectors 76, the dielectric layer 78 may bury the solder material as well. Alternatively, the solder material may be removed prior to forming the dielectric layer 78.

The dielectric layer 78 may be a polymer such as PBO, polyimide, BCB, or the like; a nitride such as silicon nitride or the like; an oxide such as silicon oxide, PSG, BSG, BPSG, or the like; an encapsulant, molding compound, or the like; the like, or a combination thereof. The dielectric layer 78 may be formed, for example, by spin coating, lamination, chemical vapor deposition (CVD), or the like. In some embodiments, the conductive connectors 76 remain buried and are exposed during a subsequent process for packaging the interconnect device 50, such as that described below for FIG. 17. Exposing the conductive connectors 76 may remove any solder regions that may be present on the conductive connectors 76.

Still referring to FIG. 1, the interconnect device 50 may include through substrate vias (TSVs) 54 that extend through the substrate 52 to electrically connect the first interconnect structure 60 to external components on the side of the substrate 52 opposite the first interconnect structure 60. In other embodiments, the interconnect device 50 does not include TSVs 54. In an embodiment, the TSVs 54 may be formed by initially forming through substrate via (TSV) openings into the substrate 52 prior to forming the first interconnect structure 60. The TSV openings may be formed by applying and patterning a photoresist (not shown) to expose regions of the substrate 52, and then etching the exposed portions of the substrate 52 to the desired depth. The TSV openings may be formed so as to extend partially into the substrate 52, and may extend to a depth greater than the eventual desired height of the substrate 52.

Once the TSV openings have been formed within the substrate 52, the TSV openings may be lined with a liner (not illustrated). The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. Once the liner has been formed along the sidewalls and bottom of the TSV openings, a barrier layer (also not independently illustrated) may be formed and the remainder of the TSV openings may be filled with conductive material, forming the TSVs 54. The conductive material may comprise copper, although other suitable materials such as aluminum, alloys, doped polysilicon, combinations thereof, and the like, may alternatively be utilized. The conductive material may be formed by electroplating copper onto a seed layer (not shown), filling and overfilling the TSV openings. Once the TSV openings have been filled, excess liner, barrier layer, seed layer, and conductive material outside of the TSV openings may be removed (e.g., using a CMP process, a grinding process, or the like) to form the TSVs 54. The substrate 52 may then be thinned (e.g., using a CMP process, a grinding process, or the like) to expose the TSVs 54, as shown in FIG. 1.

Figure 2:
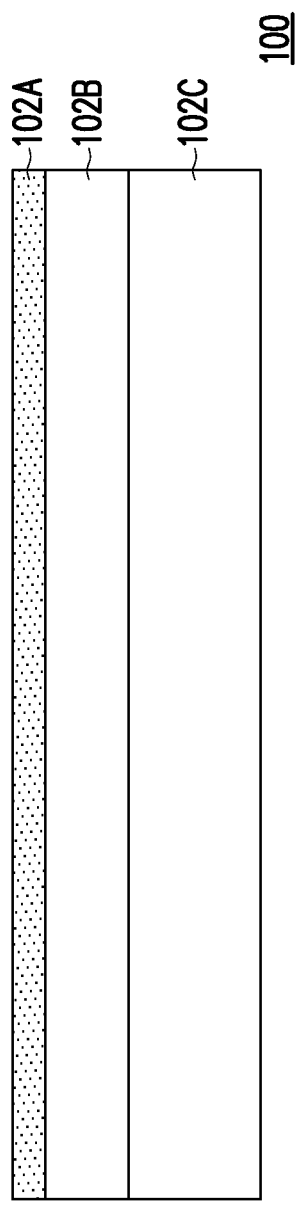

FIGS. 2 through 13 show cross-sectional views of intermediate steps of forming a photonic package 100 (see FIGS. 12-13), in accordance with some embodiments. In some embodiments, the photonic package 100 acts as an input/output (I/O) interface between optical signals and electrical signals in the photonic system 300 (see FIG. 24). Turning first to FIG. 2, a buried oxide ("BOX") substrate 102 is provided, in accordance with some embodiments. The BOX substrate 102 includes an oxide layer 102B formed over a substrate 102C, and a silicon layer 102A formed over the oxide layer 102B. The substrate 102C may be, for example, a material such as a glass, ceramic, dielectric, a semiconductor, the like, or a combination thereof. In some embodiments, the substrate 102C may be a semiconductor substrate, such as a bulk semiconductor or the like, which may be doped (e.g., with a p-type or an n-type dopant) or undoped. The substrate 102C may be a wafer, such as a silicon wafer (e.g., a 12-inch silicon wafer). Other substrates, such as a multi-layered or gradient substrate may also be used. In some embodiments, the semiconductor material of the substrate 102C may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The oxide layer 102B may be, for example, a silicon oxide or the like. In some embodiments, the oxide layer 102B may have a thickness between about 0.5 μm and about 4 in some embodiments. The silicon layer 102A may have a thickness between about 0.1 μm and about 1.5 in some embodiments. The BOX substrate 102 may be referred to as having a front side or front surface (e.g., the side facing upwards in FIG. 2), and a back side or back surface (e.g., the side facing downwards in FIG. 2).

Figure 3:
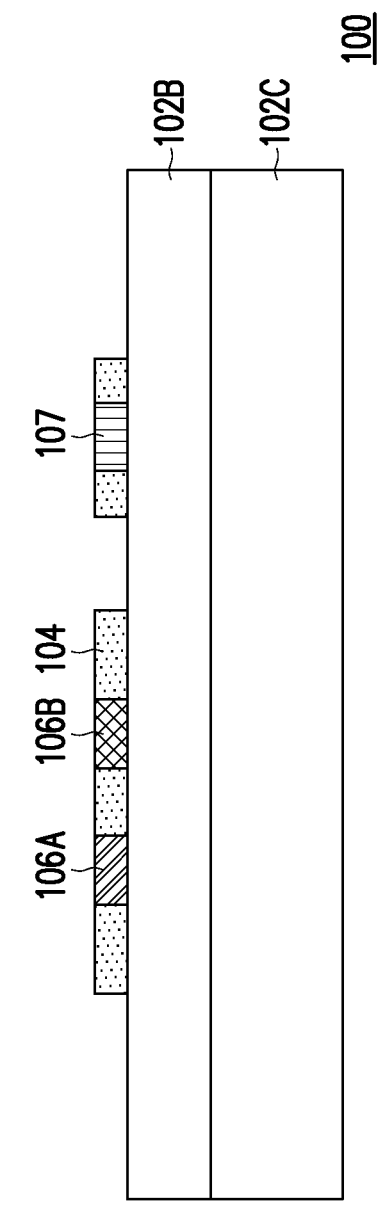

In FIG. 3, the silicon layer 102A is patterned to form silicon regions for waveguides 104, photonic components 106A-B, and couplers 107, in accordance with some embodiments. The silicon layer 102A may be patterned using suitable photolithography and etching techniques. For example, a hardmask layer (e.g., a nitride layer or other dielectric material, not shown in FIG. 3) may be formed over the silicon layer 102A and patterned, in some embodiments. The pattern of the hardmask layer may then be transferred to the silicon layer 102A using one or more etching techniques, such as dry etching and/or wet etching techniques. For example, the silicon layer 102A may be etched to form recesses defining the waveguides 104, with sidewalls of the remaining unrecessed portions defining sidewalls of the waveguides 104. In some embodiments, more than one photolithography and etching sequence may be used in order to pattern the silicon layer 102A. One waveguide 104 or multiple waveguides 104 may be patterned from the silicon layer 102A. If multiple waveguides 104 are formed, the multiple waveguides 104 may be individual separate waveguides 104 or connected as a single continuous structure. In some embodiments, one or more of the waveguides 104 form a continuous loop. For example, in the cross-sectional view illustrated in FIG. 3, the portions of the waveguides 104 shown may be part of a continuous loop comprising a single waveguide 104. Other configurations or arrangements of waveguides 104, the photonic components 106A-B, or the couplers 107 are possible. In some cases, the waveguides 104, the photonic components 106A-B, and the couplers 107 may be collectively referred to as "the photonic layer."

The photonic components 106A-B may be integrated with the waveguides 104, and may be formed with the silicon waveguides 104. The photonic components 106A-B may be optically coupled to the waveguides 104 to interact with optical signals within the waveguides 104. The photonic components 106A-B may include, for example, photodetectors 106A and/or modulators 106B. For example, a photodetector 106A may be optically coupled to the waveguides 104 to detect optical signals within the waveguides 104, and a modulator 106B may be optically coupled to the waveguides 104 to generate optical signals within the waveguides 104 by modulating optical power within the waveguides 104. In this manner, the photonic components 106A-B facilitate the input/output (I/O) of optical signals to and from the waveguides 104. In other embodiments, the photonic components may include other active or passive components, such as laser diodes, optical signal splitters, or other types of photonic structures or devices. Optical power may be provided to the waveguides 104 by, for example, an optical fiber 150 (see FIGS. 12-13) coupled to an external light source, or the optical power may be generated by a photonic component within the photonic package 100 such as a laser diode.

In some embodiments, the photodetectors 106A may be formed by, for example, partially etching regions of the waveguides 104 and growing an epitaxial material on the remaining silicon of the etched regions. The waveguides 104 may be etched using acceptable photolithography and etching techniques. The epitaxial material may comprise, for example, a semiconductor material such as germanium (Ge), which may be doped or undoped. In some embodiments, an implantation process may be performed to introduce dopants within the silicon of the etched regions as part of the formation of the photodetectors 104A. The silicon of the etched regions may be doped with p-type dopants, n-type dopants, or a combination.

In some embodiments, the modulators 106B may be formed by, for ex ample, partially etching regions of the waveguides 104 and then implanting appropriate dopants within the remaining silicon of the etched regions. The waveguides 104 may be etched using acceptable photolithography and etching techniques. In some embodiments, the etched regions used for the photodetectors 106A and the etched regions used for the modulators 106B may be formed using one or more of the same photolithography or etching steps. The silicon of the etched regions may be doped with p-type dopants, n-type dopants, or a combination. In some embodiments, the etched regions used for the photodetectors 106A and the etched regions used for the modulators 106B may be implanted using one or more of the same implantation steps.

Figure 12:
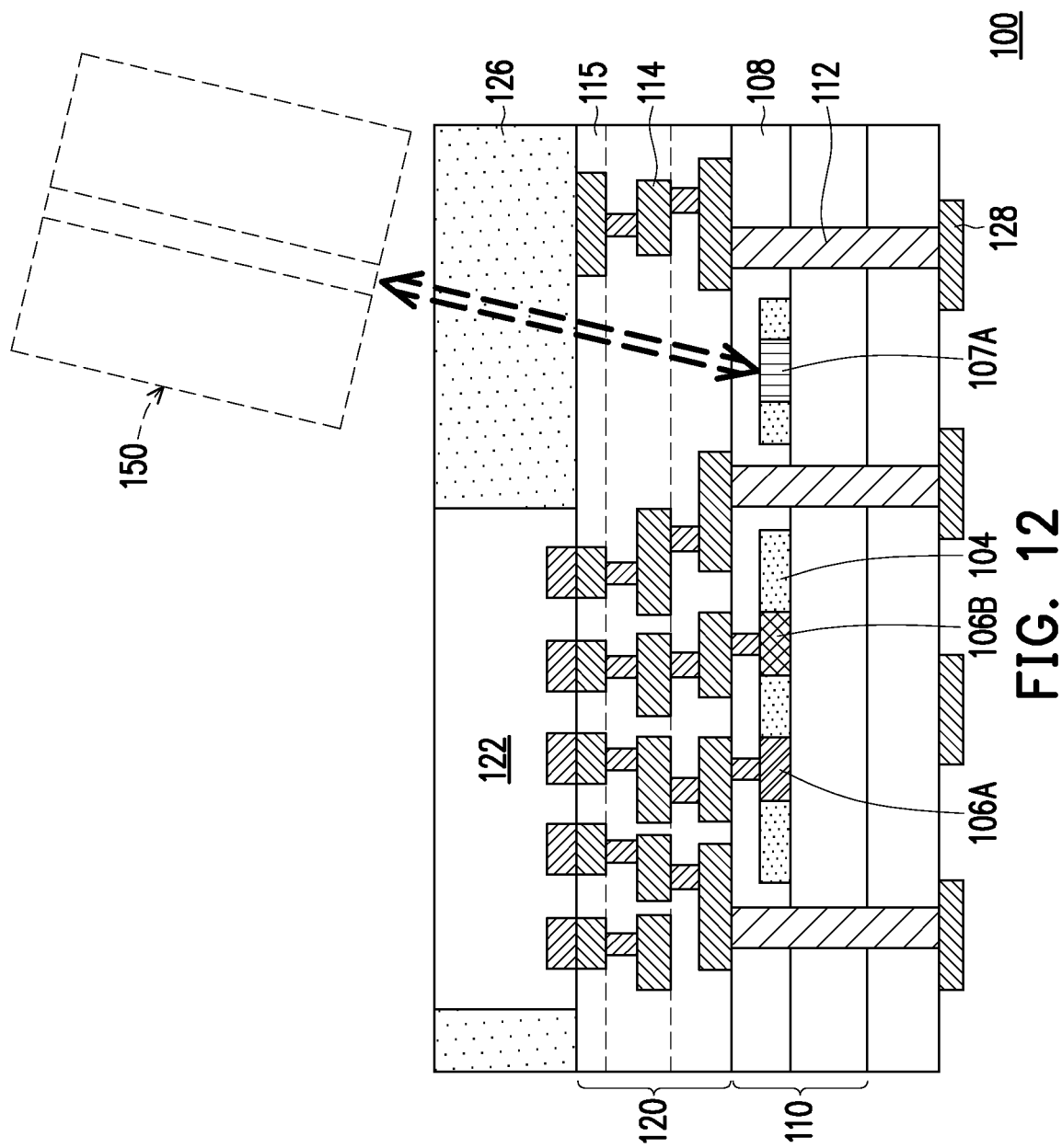
FIGS. 12 and 13 illustrate cross-sectional views of photonic packages, in accordance with some embodiments.
Figure 13:
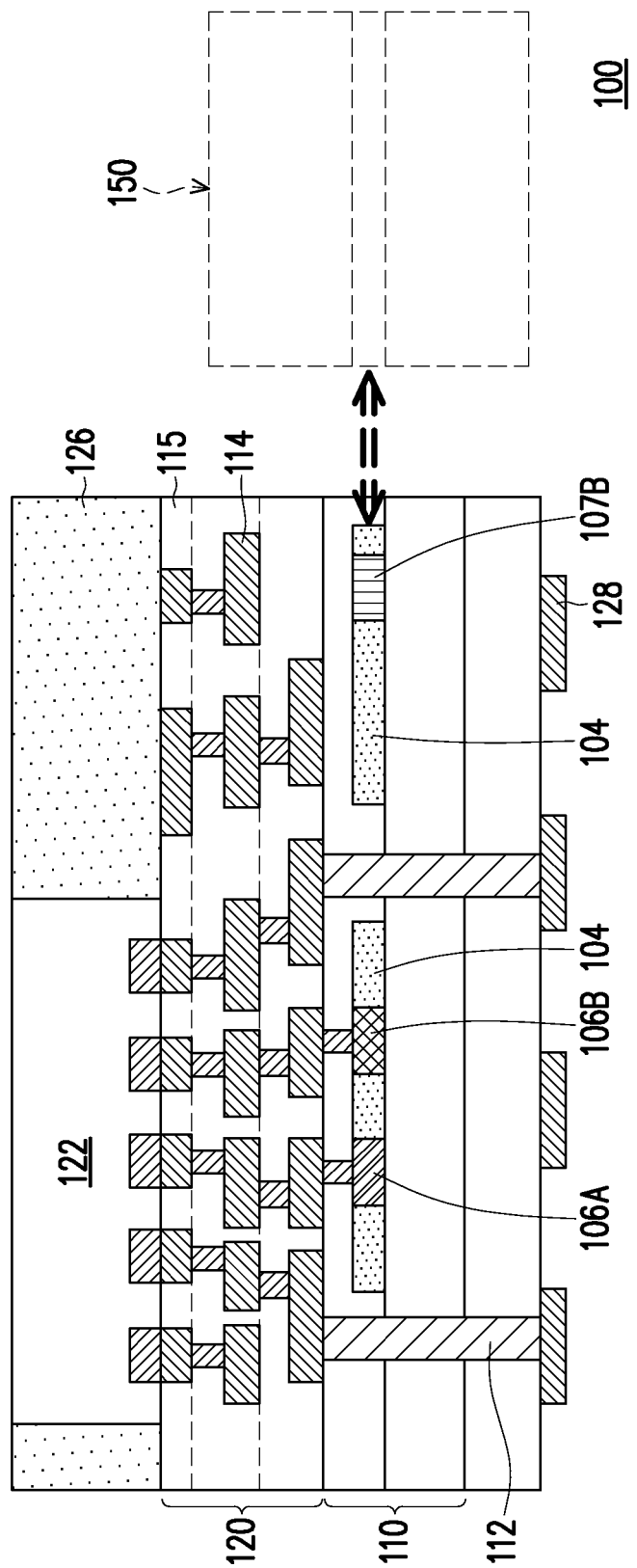

In some embodiments, one or more couplers 107 may be integrated with the waveguides 104, and may be formed with the waveguides 104. The couplers 107 may include grating couplers 107A and/or edge couplers 107B (see FIGS. 12-13). The couplers 107 allow for optical signals and/or optical power to be transferred between an optical fiber 150 and the waveguides 104 of the photonic package 100. In some embodiments, the couplers 107 include grating couplers 107A, which allow optical signals and/or optical power to be transferred between the photonic package 100 and an optical fiber 150 that is vertically mounted over the photonic package 100, such as shown in FIG. 12. In some embodiments, the couplers 107 include edge couplers 107B, which allow optical signals and/or optical power to be transferred between the photonic package 100 and an optical fiber 150 that is horizontally mounted near a sidewall of the photonic package 100, such as shown in FIG. 13. A photonic package 100 may include a single coupler 107, multiple couplers 107, or multiple types of couplers 107, in some embodiments. The couplers 107 may be formed using acceptable photolithography and etching techniques. In some embodiments, the couplers 107 are formed using the same photolithography or etching steps as the waveguides 104 and/or the photonic components 106A-B. In other embodiments, the couplers 107 are formed after the waveguides 104 and/or the photonic components 106A-B are formed.

In FIG. 4, a dielectric layer 108 is formed on the front side of the BOX substrate 102 to form a photonic routing structure 110, in accordance with some embodiments. The dielectric layer 108 is formed over the waveguides 104, the photonic components 106A-B, the couplers 107, and the oxide layer 102B. The dielectric layer 108 may be formed of one or more layers of silicon oxide, silicon nitride, a combination thereof, or the like, and may be formed by CVD, PVD, atomic layer deposition (ALD), a spin-on-dielectric process, the like, or a combination thereof. In some embodiments, the dielectric layer 108 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other dielectric materials formed by any acceptable process may be used. In some embodiments, the dielectric layer 108 is then planarized using a planarization process such as a CMP process, a grinding process, or the like. The dielectric layer 108 may be formed having a thickness over the oxide layer 102B between about 50 nm and about 500 nm, or may be formed having a thickness over the waveguides 104 between about 10 nm and about 200 nm, in some embodiments. In some cases, a thinner dielectric layer 108 may allow for more efficient optical coupling between a grating coupler 107A and a vertically mounted optical fiber 150 (see FIG. 12).

Due to the difference in refractive indices of the materials of the wave guides 104 and dielectric layer 108, the waveguides 104 have high internal reflections such that light is substantially confined within the waveguides 104, depending on the wavelength of the light and the refractive indices of the respective materials. In an embodiment, the refractive index of the material of the waveguides 104 is higher than the refractive index of the material of the dielectric layer 108. For example, the waveguides 104 may comprise silicon, and the dielectric layer 108 may comprise silicon oxide and/or silicon nitride.

In FIG. 5, openings 111 are formed extending into the substrate 102C, in accordance with some embodiments. The openings 111 are formed extending through the dielectric layer 108 and the oxide layer 102B, and extend partially into the substrate 102C. The openings 111 may be formed by acceptable photolithography and etching techniques, such as by forming and patterning a photoresist and then performing an etching process using the patterned photoresist as an etching mask. The etching process may include, for example, a dry etching process and/or a wet etching process.

Figure 6:
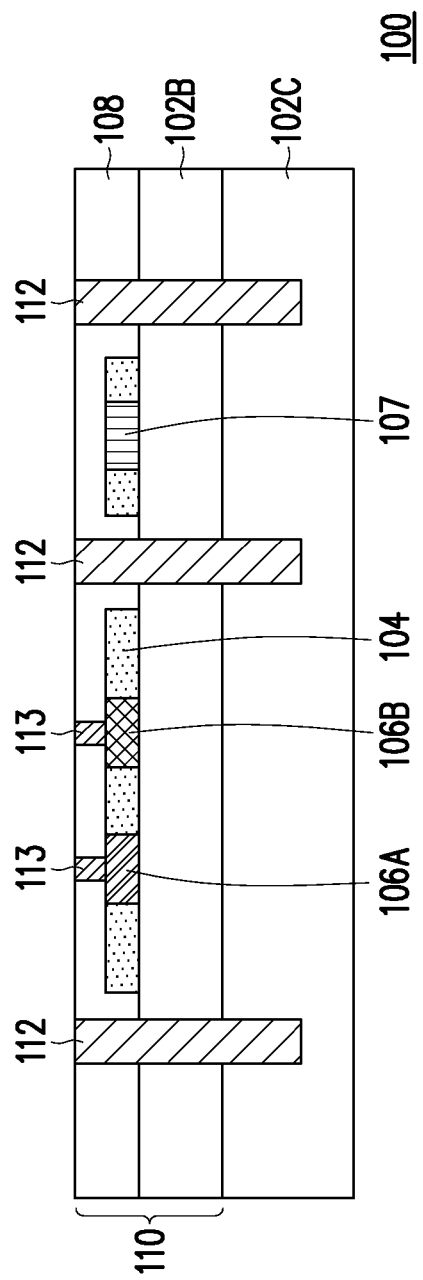

In FIG. 6, a conductive material is formed in the openings 111, thereby forming vias 112, in accordance with some embodiments. In some embodiments, a liner (not shown), such as a diffusion barrier layer, an adhesion layer, or the like, may be formed in the openings 111 from TaN, Ta, TiN, Ti, CoW, or the like, and may be formed using suitable a deposition process such as ALD or the like. In some embodiments, a seed layer (not shown), which may include copper or a copper alloy may then be deposited in the openings 111. The conductive material of the vias 112 is formed in the openings 111 using, for example, ECP or electro-less plating. The conductive material may include, for example, a metal or a metal alloy such as copper, silver, gold, tungsten, cobalt, aluminum, or alloys thereof. A planarization process (e.g., a CMP process or a grinding process) may be performed to remove excess conductive material along the top surface of the dielectric layer 108, such that top surfaces of the vias 112 and the dielectric layer 108 are level.

FIG. 6 also shows the formation of contacts 113 that extend through the dielectric layer 108 and are electrically connected to the photonic components 106A-B. The contacts 113 allow electrical power or electrical signals to be transmitted to the photonic components 106A-B and electrical signals to be transmitted from the photonic components 106A-B. In this manner, the photonic components 106A-B may convert electrical signals (e.g., from an electronic die 122, see FIG. 8) into optical signals transmitted by the waveguides 104, and/or convert optical signals from the waveguides 104 into electrical signals (e.g., that may be received by an electronic die 122). The contacts 113 may be formed before or after formation of the vias 112, and the formation of the contacts 113 and the formation of the vias 112 may share some steps such as deposition of the conductive material and/or planarization. In some embodiments, the contact may be formed by a damascene process, e.g., single damascene, dual damascene, or the like. For example, in some embodiments, openings (not shown) for the contacts 113 are first formed in the dielectric layer 108 using acceptable photolithography and etching techniques. A conductive material may then be formed in the openings, forming the contacts 113. Excess conductive material may be removed using a CMP process or the like. The conductive material of the contacts 113 may be formed of a metal or a metal alloy including aluminum, copper, tungsten, or the like, which may be the same as that of the vias 112. The contacts 113 may be formed using other techniques or materials in other embodiments.

Figure 7:
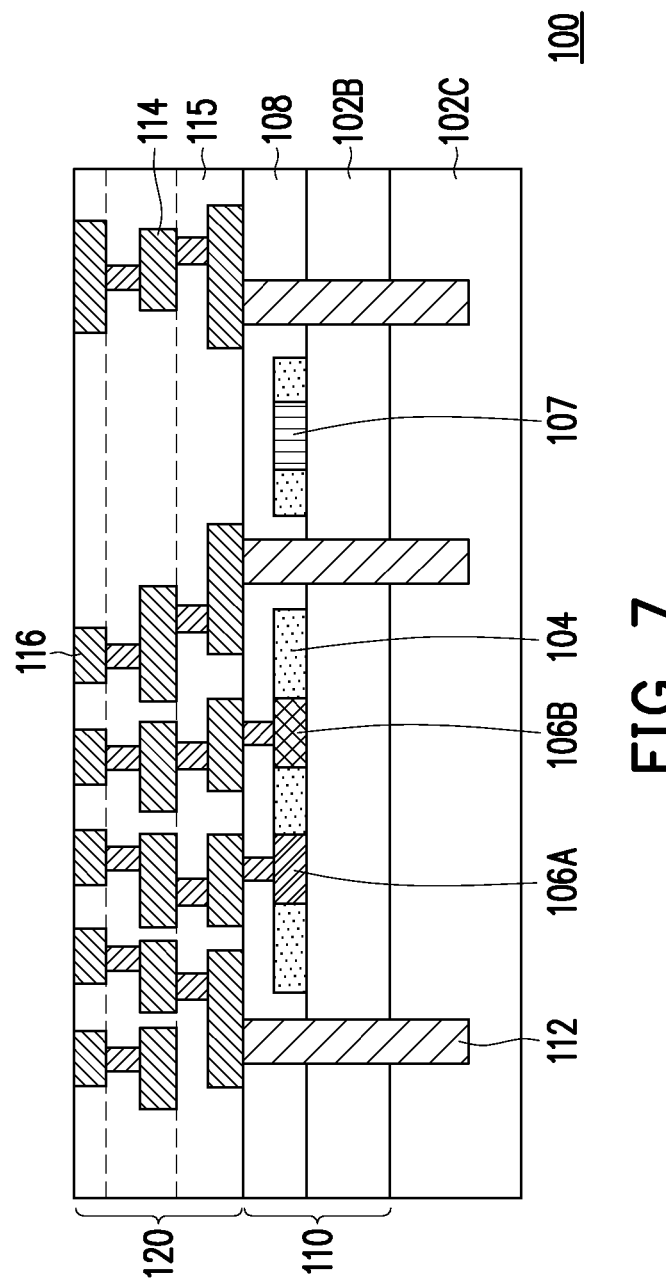

In FIG. 7, a second interconnect structure 120 is formed over the dielectric layer 108, in accordance with some embodiments. The second interconnect structure 120 includes dielectric layers 115 and conductive features 114 formed in the dielectric layers 115 that provide interconnections and electrical routing. For example, the second interconnect structure 120 may connect the vias 112, the contacts 113, and/or overlying devices such as electronic dies 122 (see FIG. 8). The dielectric layers 115 may be, for example, insulating or passivating layers, and may comprise one or more materials similar to those described above for the dielectric layer 108, such as a silicon oxide or a silicon nitride, or may comprise a different material. The dielectric layers 115 may be transparent to about the same wavelengths of light as the dielectric layer 108. The dielectric layers 115 may be formed using a technique similar to those described above for the dielectric layer 108 or using a different technique. The conductive features 114 may include conductive lines and vias, and may be formed by a damascene process, e.g., single damascene, dual damascene, or the like. As shown in FIG. 6, conductive pads 116 are formed in the topmost layer of the dielectric layers 115. A planarization process (e.g., a CMP process or the like) may be performed after forming the conductive pads 116 such that surfaces of the conductive pads 116 and the topmost dielectric layer 115 are substantially coplanar. The second interconnect structure 120 may include more or fewer dielectric layers 115, conductive features 114, or conductive pads 116 than shown in FIG. 6. The second interconnect structure 120 may be formed having a thickness between about 4 µm and about 7 µm, in some embodiments.

In some embodiments, some regions of the second interconnect structure 120 are substantially free of the conductive features 114 or conductive pads 116 in order to allow transmission of optical power or optical signals through the dielectric layers 115. For example, these metal-free regions may extend between a grating coupler 107A and a vertically mounted optical fiber 150 (see FIG. 12) to allow optical power or optical signals to be coupled from the waveguides 104 into the vertically mounted optical fiber 150 and/or to be coupled from the vertically mounted optical fiber 150 into the waveguides 104. In some cases, a thinner second interconnect structure 120 may allow for more efficient optical coupling between a grating coupler 107A and a vertically mounted optical fiber 150.

Figure 8:
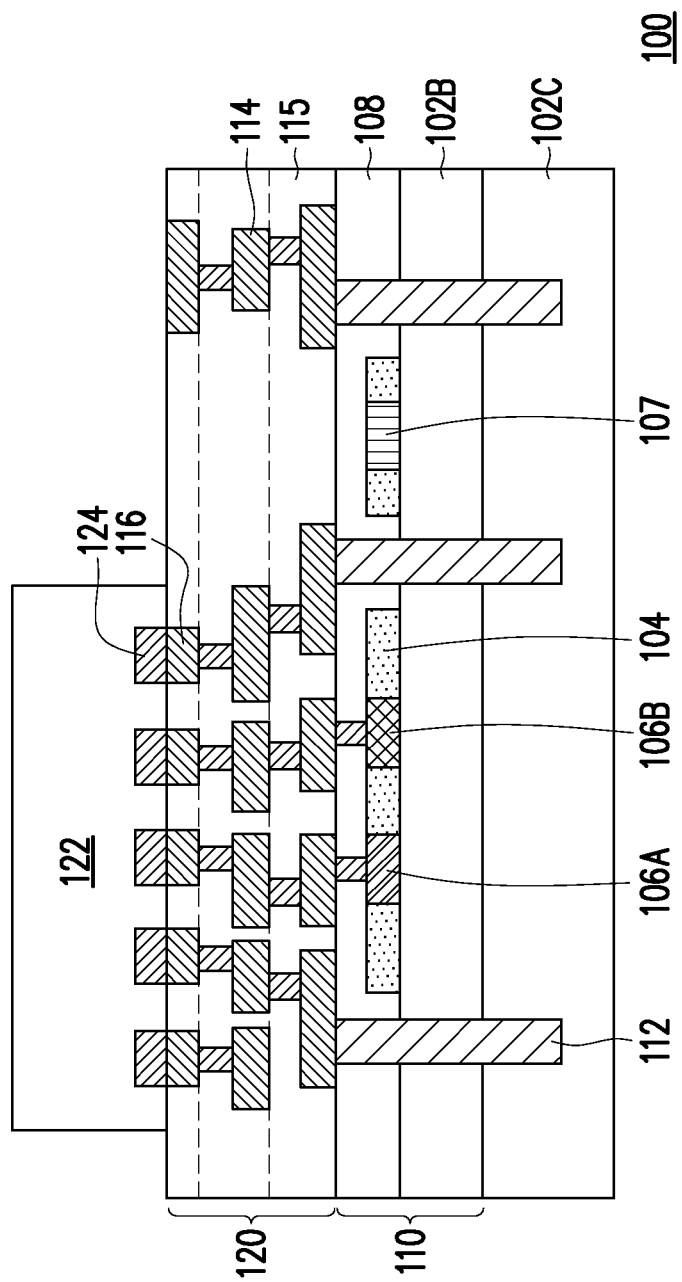

In FIG. 8, an electronic die 122 is bonded to the second interconnect structure 120, in accordance with some embodiments. The electronic dies 122 may be, for example, semiconductor devices, dies, or chips that communicate with the photonic components 106A-B using electrical signals. One electronic die 122 is shown in FIG. 8, but a photonic package 100 may include two or more electronic dies 122 in other embodiments. In some cases, multiple electronic dies 122 may be incorporated into a single photonic package 100 in order to reduce processing cost. The electronic die 122 includes die connectors 124, which may be, for example, conductive pads, conductive pillars, or the like. In some embodiments, the electronic die 122 may have a thickness between about 10 µm and about 35 µm, such as about 25 µm.

The electronic die 122 may include integrated circuits for interfacing with the photonic components 106A-B, such as circuits for controlling the operation of the photonic components 106A-B. For example, the electronic die 122 may include controllers, drivers, transimpedance amplifiers, the like, or combinations thereof. The electronic die 122 may also include a CPU, in some embodiments. In some embodiments, the electronic die 122 includes circuits for processing electrical signals received from photonic components 106A-B, such as for processing electrical signals received from a photodetector 106A. The electronic die 122 may control high-frequency signaling of the photonic components 106A-B according to electrical signals (digital or analog) received from another device, such as from a processing die 142 (see FIG. 24), in some embodiments. In some embodiments, the electronic die 122 may be an electronic integrated circuit (EIC) or the like that provides Serializer/Deserializer (SerDes) functionality. In this manner, the electronic die 122 may act as part of an I/O interface between optical signals and electrical signals within a photonic system 300.

In some embodiments, the electronic die 122 is bonded to the second interconnect structure 120 by dielectric-to-dielectric bonding and/or metal-to-metal bonding (e.g., direct bonding, fusion bonding, oxide-to-oxide bonding, hybrid bonding, or the like). In such embodiments, covalent bonds may be formed between oxide layers, such as the topmost dielectric layers 115 and surface dielectric layers (not shown) of the electronic die 122. During the bonding, metal bonding may also occur between the die connectors 124 of the electronic die 122 and the conductive pads 116 of the second interconnect structure 120. The use of dielectric-to-dielectric bonding may allow for materials transparent to the relevant wavelengths of light to be deposited over the second interconnect structure 120 and/or around the electronic die 122 instead of opaque materials such as an encapsulant or a molding compound. For example, the dielectric material 126 may be formed from a suitably transparent material such as silicon oxide instead of an opaque material such as a molding compound. The use of a suitably transparent material for the dielectric material 126 in this manner allows optical signals to be transmitted through the dielectric material 126, such as transmitting optical signals between a grating coupler 107A and a vertically mounted optical fiber 150 located above the dielectric material 126. Additionally, by bonding the electronic die 122 to the second interconnect structure 120 in this manner, the thickness of the resulting photonic package 100 may be reduced, and the optical coupling between a grating coupler 107A and a vertically mounted optical fiber 150 may be improved. In this manner, the size or processing cost of a photonic system may be reduced, and the optical coupling to external components may be improved. In some embodiments, the photonic packages 100 described herein could be considered system-on-chip (SoC) or system-on-integrated-circuit (SoIC) devices.

In some embodiments, before performing the bonding process, a surface treatment is performed on the electronic die 122. In some embodiments, the top surfaces of the second interconnect structure 120 and/or the electronic die 122 may first be activated utilizing, for example, a dry treatment, a wet treatment, a plasma treatment, exposure to an inert gas, exposure to $H_2$, exposure to $N_2$, exposure to $O_2$, the like, or combinations thereof. However, any suitable activation process may be utilized. After the activation process, the second interconnect structure 120 and/or the electronic die 122 may be cleaned using, e.g., a chemical rinse. The electronic die 122 is then aligned with the second interconnect structure 120 and placed into physical contact with the second interconnect structure 120. The electronic die 122 may be placed on the second interconnect structure 120 using a pick-and-place process, for example. The second interconnect structure 120 and the electronic die 122 may then be subjected to a thermal treatment and/or pressed against each other (e.g., by applying contact pressure) to bond the second interconnect structure 120 and the electronic die 122. For example, the second interconnect structure 120 and the electronic die 122 may be subjected to a pressure of about 200 kPa or less, and to a temperature between about 200° C. and about 400° C. The second interconnect structure 120 and the electronic die 122 may then be subjected to a temperature at or above the eutectic point of the material of the conductive pads 116 and the die connectors 124 (e.g., between about 150° C. and about 650° C.) to fuse the conductive pads 116 and the die connectors 124. In this manner, the dielectric-to-dielectric bonding and/or metal-to-metal bonding of second interconnect structure 120 and the electronic die 122 forms a bonded structure. In some embodiments, the bonded structure is baked, annealed, pressed, or otherwise treated to strengthen or finalize the bonds.

Figure 9:
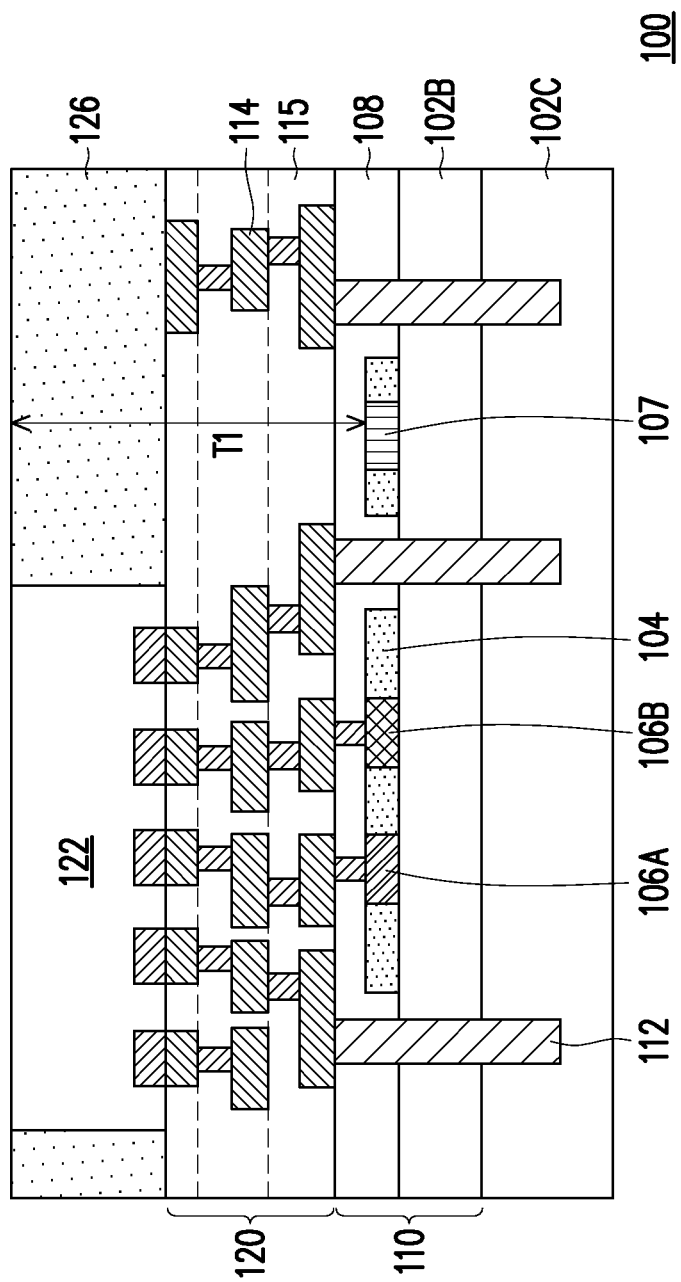

Turning to FIG. 9, a dielectric material 126 is formed over the electronic dies 122 and the second interconnect structure 120, in accordance with some embodiments. The dielectric material 126 may be formed of silicon oxide, silicon nitride, a polymer, the like, or a combination thereof. The dielectric material 126 may be formed by CVD, PVD, ALD, a spin-on-dielectric process, the like, or a combination thereof. In some embodiments, the dielectric material 126 may be formed by HDP-CVD, FCVD, the like, or a combination thereof. The dielectric material 126 may be a gap-fill material in some embodiments, which may include one or more of the example materials above. In some embodiments, the dielectric material 126 may be a material (e.g., silicon oxide) that is substantially transparent to light at wavelengths suitable for transmitting optical signals or optical power between a vertically mounted optical fiber 150 and a grating coupler 107A. In some embodiments in which a grating coupler 107A is not present, the dielectric material 126 may comprise a relatively opaque material such as an encapsulant, molding compound, or the like. Other dielectric materials formed by any acceptable process may be used.

Still referring to FIG. 9, the dielectric material 126 may be planarized using a planarization process such as a CMP process, a grinding process, or the like. The planarization process may expose the electronic dies 122 such that surfaces of the electronic dies 122 and surfaces of the dielectric material 126 are coplanar. After planarization, the dielectric material 126 may have a thickness over the second interconnect structure 120 that is between about 10 μm and about 40 μm. In some embodiments, the combined thickness T1 of the dielectric layer 108, the dielectric layers 115, and the dielectric material 126 over the grating couplers 107A may be between about 14 μm and about 50 μm. In some cases, a smaller thickness T1 may allow for more efficient optical coupling between a grating coupler 107A and a vertically mounted optical fiber 150 (see FIG. 12). For example, in some embodiments, the thickness T1 may be less than about 30 μm.

Figure 10:
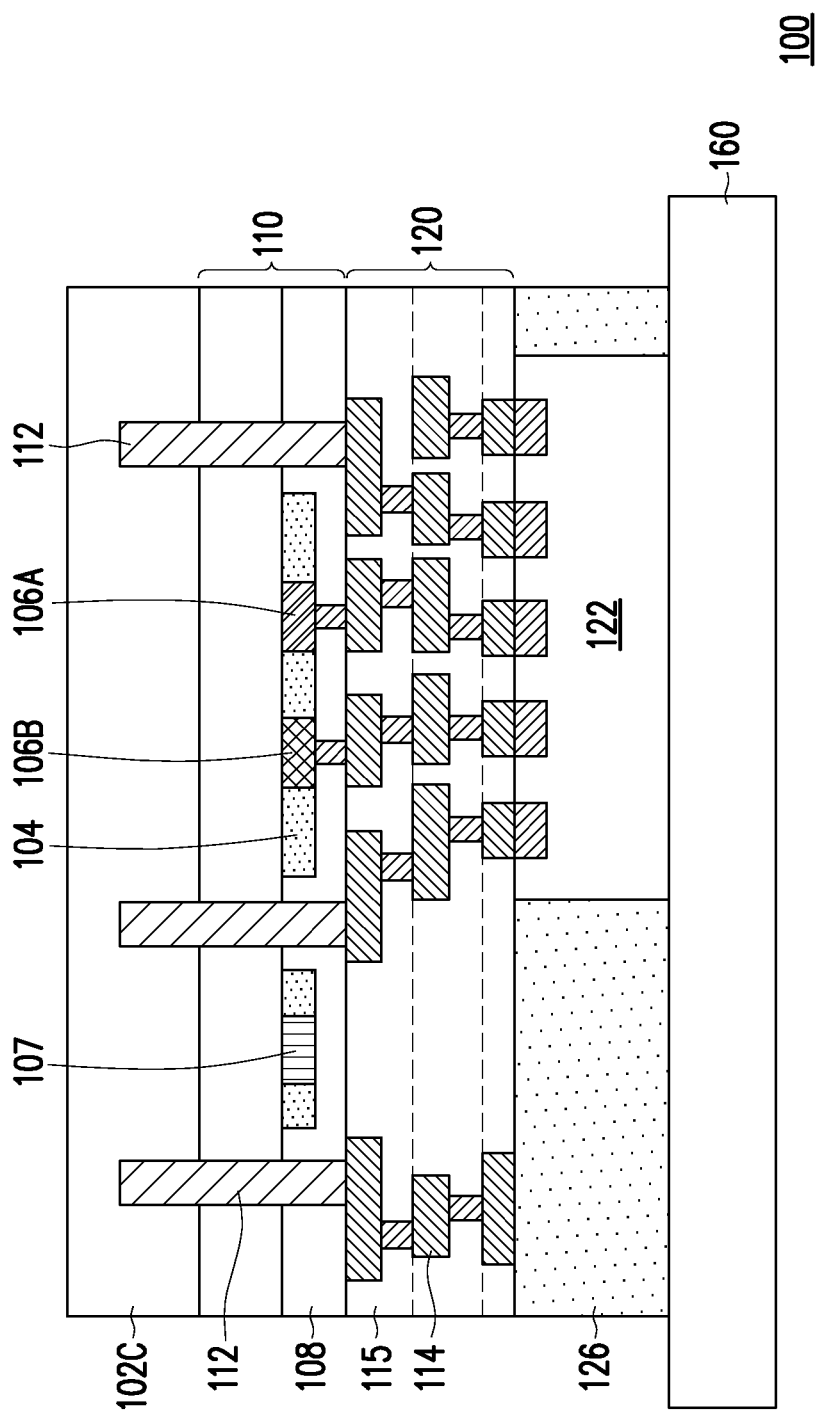

In FIG. 10, the structure is flipped over and attached to a first carrier 160, in accordance with some embodiments. The first carrier 160 may be, for example, a wafer (e.g., a silicon wafer), a panel, a glass substrate, a ceramic substrate, or the like. The structure may be attached to the first carrier 160 using, for example, an adhesive or a release layer (not shown).

Figure 11:
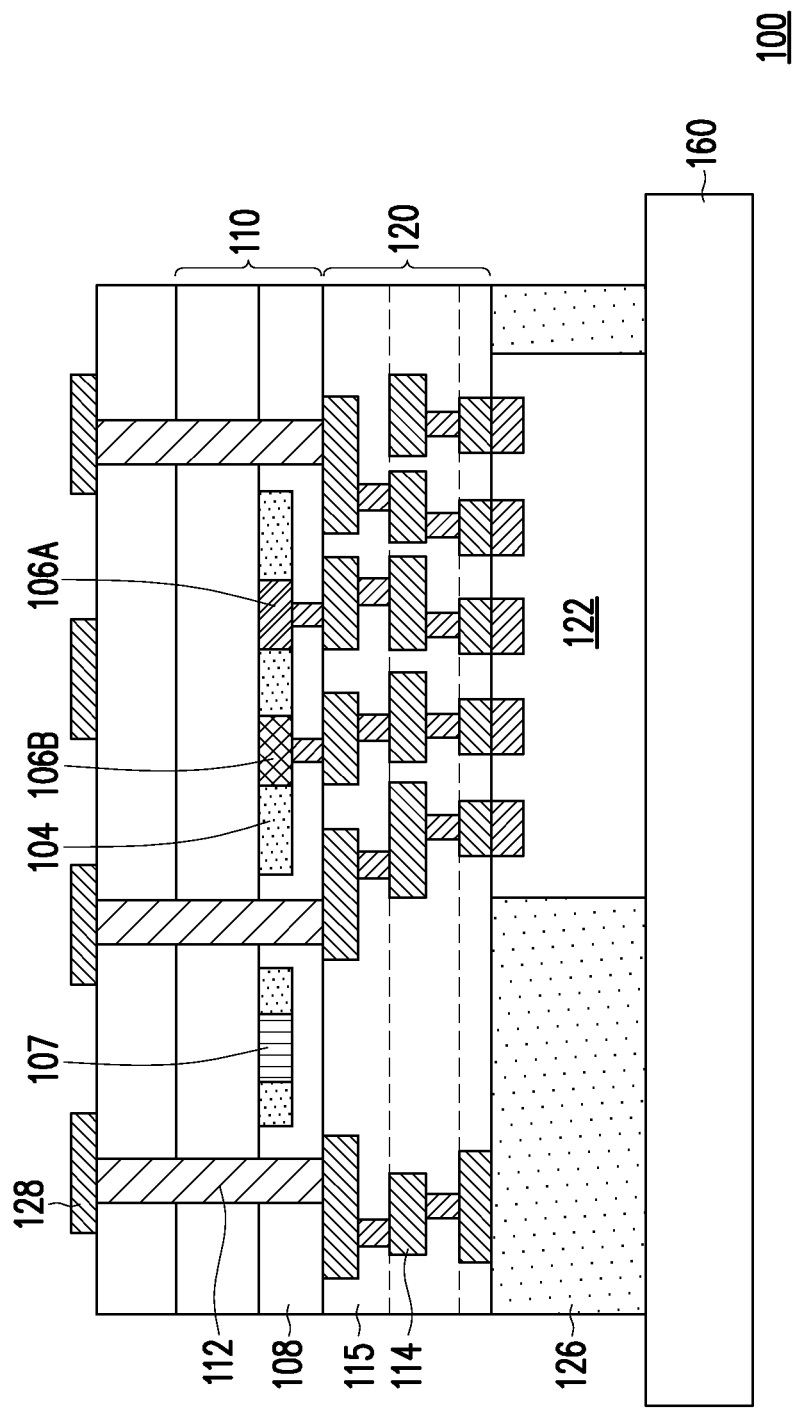

In FIG. 11, the back side of the substrate 102C is thinned to expose the vias 112, and conductive pads 128 are formed, in accordance with some embodiments. The substrate 102C may be thinned by a CMP process, a mechanical grinding, or the like. In FIG. 10, conductive pads 128 are formed on the exposed vias 112 and the substrate 102C, in accordance with some embodiments. The conductive pads 128 may be conductive pads or conductive pillars that are electrically connected to the second interconnect structure 120. The conductive pads 128 may be formed from a conductive material such as copper, another metal or metal alloy, the like, or combinations thereof. The material of the conductive pads 128 may be formed by a suitable process, such as plating. For example, in some embodiments, the conductive pads 128 are metal pillars (such as copper pillars) formed by a sputtering, printing, electro plating, electroless plating, CVD, or the like. The metal pillars may be solder free and have substantially vertical sidewalls. In some embodiments, a metal cap layer (not shown) is formed on the top of the conductive pads 128. The metal cap layer may include nickel, tin, tin-lead, gold, silver, palladium, indium, nickel-palladium-gold, nickel-gold, the like, or a combination thereof and may be formed by a plating process. In some embodiments, underbump metallizations (UBMs, not shown) may be formed over the conductive pads 128. In some embodiments, a passivation layer (not shown) such as a silicon oxide or silicon nitride may be formed over the substrate 102C to surround or partially cover the conductive pads 128. In some embodiments, a solder material (not shown) such as solder bumps may be formed over the conductive pads 128.

FIGS. 12-13 illustrate photonic packages 100 optically coupled to optical fibers 150, in accordance with some embodiments. The photonic packages 100 shown in FIGS. 12-13 have been removed from the first carrier 160 and are shown flipped over relative to FIG. 11. FIG. 12 illustrates a photonic package 100 comprising a grating coupler 107A configured to optically couple to a vertically mounted optical fiber 150, and FIG. 13 illustrates a photonic package 100 comprising an edge coupler 107B configured to optically couple to a horizontally mounted optical fiber 150. The optical fiber 150 may be mounted to the photonic package 100 using an optical glue 152 (see FIGS. 24 and 25) or the like. The optical fibers 150 are shown in FIGS. 12-13 for illustrative purposes, and in some cases an optical fiber 150 is attached to a photonic package 100 after the photonic package 100 is incorporated within a photonic system 300 (see FIG. 24).

Referring to FIG. 12, a vertically mounted optical fiber 150 may be mounted at an angle with respect to the vertical axis or may be laterally offset from the grating coupler 107A. A grating coupler 107A may be located near the edges of the photonic package 100 or away from the edges of the photonic package 100. The optical signals and/or optical power transmitted between the vertically mounted optical fiber 150 and the grating coupler 107A are transmitted through the dielectric layer 108, the dielectric layers 115, and the dielectric material 126 formed over the grating coupler 107A. For example, optical signals may be transmitted from the optical fiber 150 to the grating coupler 107A and into the waveguides 104, wherein the optical signals may be detected by a photodetector 106A and transmitted as electrical signals into an electronic die 122. Optical signals generated within the waveguides 104 by the modulator 106B may similarly be transmitted from the grating coupler 107A to the vertically mounted optical fiber 150. Mounting the optical fiber 150 in a vertical orientation may allow for improved optical coupling, reduced processing cost, or greater design flexibility of a photonic package 100 or a photonic system 300.

Referring to FIG. 13, a horizontally mounted optical fiber 150 may be mounted at an angle with respect to the horizontal axis or may be vertically offset from the edge coupler 107B. An edge coupler 107B may be located near an edges or sidewall of the photonic package 100. The optical signals and/or optical power transmitted between the horizontally mounted optical fiber 150 and the edge coupler 107B are transmitted through the dielectric layer 108. For example, optical signals may be transmitted from the horizontally mounted optical fiber 150 to the edge coupler 107B and into the waveguides 104, wherein the optical signals may be detected by a photodetector 106A and transmitted as electrical signals into an electronic die 122. Optical signals generated within the waveguides 104 by the modulator 106B may similarly be transmitted from the edge coupler 107B to the horizontally mounted optical fiber 150. In this manner, a photonic package 100 or a photonic system 300 as described herein may be coupled to optical fibers 150 in different configurations, allowing for greater flexibility of design.

FIGS. 14 through 22 illustrate cross-sectional views of intermediate steps during a process for forming an interposer structure 250 incorporating interconnect devices 50, in accordance with some embodiments. In FIG. 14, a first carrier substrate 202 is provided, and through vias 206 are formed on the first carrier substrate 202. The first carrier substrate 202 may be a glass carrier substrate, a ceramic carrier substrate, a wafer (e.g., a silicon wafer), or the like. As shown in FIG. 15, a release layer 204 may be formed over the first carrier substrate 202. The release layer 204 may be formed of a polymer-based material, which may be removed along with the first carrier substrate 202 from the overlying structures that will be formed in subsequent steps. In some embodiments, the release layer 204 is an epoxy-based thermal-release material, which loses its adhesive property when heated, such as a light-to-heat-conversion (LTHC) release coating. In other embodiments, the release layer 204 may be an ultra-violet (UV) glue, which loses its adhesive property when exposed to UV lights. The release layer 204 may be dispensed as a liquid and cured, may be a laminate film laminated onto the first carrier substrate 202, or may be the like. The top surface of the release layer 204 may be leveled and may have a high degree of planarity.

Still referring to FIG. 14, the through vias 206 are formed over the release layer 204. As an example to form the through vias 206, a seed layer (not shown) is formed over the release layer 204. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 206.

In FIG. 15, one or more interconnect devices 50 are attached to the release layer 204. In some embodiments, the interconnect devices 50 may be attached to the release layer 204 by an adhesive (not shown). The interconnect devices 50 may be placed on the release layer 204 using, e.g., a pick-and-place process. FIG. 15 illustrates two attached interconnect devices 50, but in other embodiments, one interconnect device 50 or more than two interconnect devices 50 may be attached. In embodiments in which multiple interconnect devices 50 are attached, the interconnect devices 50 may have different sizes (e.g., different heights and/or surface areas), or may have the same size (e.g., same heights and/or surface areas). The configuration of the electrical routing 62, the optional TSVs 54, or other features of the interconnect devices 50 may be similar or different. The interconnect devices 50 may be oriented with the substrate 52 toward the first carrier substrate 202, as shown in FIG. 15, or may be oriented with the conductive connectors 76 toward the first carrier substrate 202. Different interconnect devices 50 may be attached to the release layer 204 in different orientations.

Figure 16:
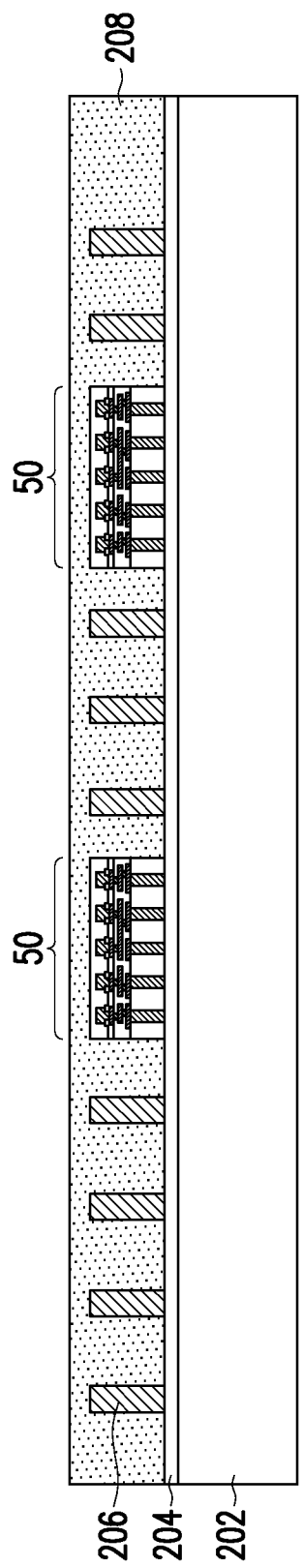

In FIG. 16, an encapsulant 208 is formed over the first carrier substrate 202, in accordance with some embodiments. After formation, the encapsulant 208 encapsulates the through vias 206 and the interconnect devices 50. The encapsulant 208 may be a molding compound, epoxy, or the like. The encapsulant 208 may be applied by compression molding, transfer molding, lamination, or the like, and may be formed over the first carrier substrate 202 such that the through vias 206 and/or the interconnect devices 50 are buried or covered. The encapsulant 208 is further formed in gap regions between the through vias 206 and/or the interconnect devices 50. The encapsulant 208 may be applied in liquid or semi-liquid form and then subsequently cured.

Figure 17:
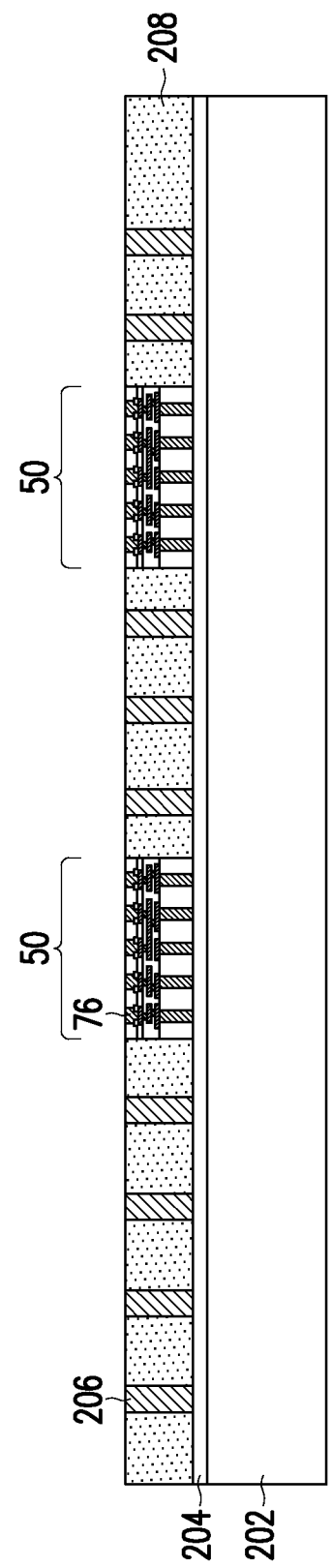

In FIG. 17, a planarization process is performed on the encapsulant 208 to expose the through vias 206 and the conductive connectors 76 of the interconnect devices 50. The planarization process may also remove material of the through vias 206, material of the dielectric layer 78 of the interconnect devices 50, and/or material of the conductive connectors 76 of the interconnect devices 50 until the conductive connectors 76 and the through vias 206 are exposed. Top surfaces of the through vias 206, the conductive connectors 76, the dielectric layers 78, or the encapsulant 208 may be coplanar after the planarization process. The planarization process may be, for example, a chemical-mechanical polish (CMP), a grinding process, or the like. In some embodiments, the planarization may be omitted, for example, if the through vias 206 and/or the conductive connectors 76 are already exposed.

Figure 18:
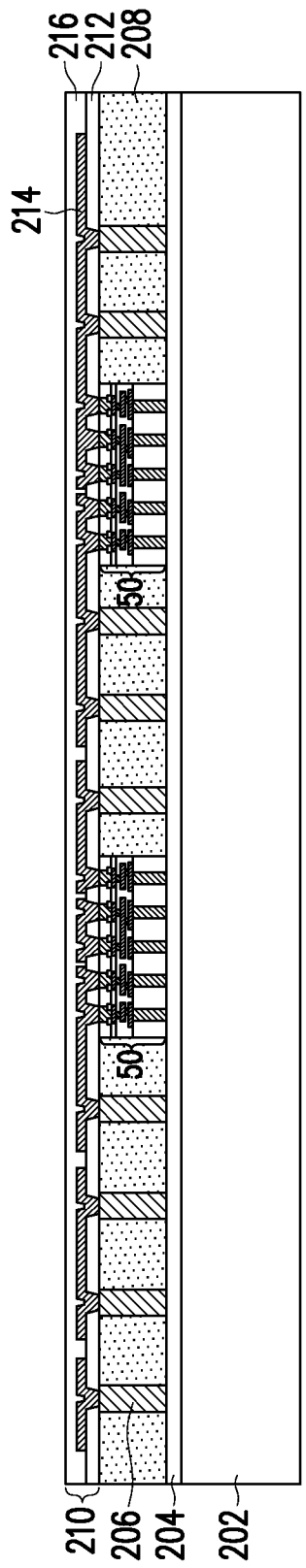

In FIG. 18, a third interconnect structure 210 is formed over the encapsulant 208, the through vias 206, and the interconnect devices 50. In the embodiment shown, the third interconnect structure 210 includes a dielectric layer 212, a metallization pattern 214 (sometimes referred to as redistribution layers or redistribution lines), and a dielectric layer 216. The third interconnect structure 210 is optional. In some embodiments, a dielectric layer without metallization patterns is formed in lieu of the third interconnect structure 210.

The dielectric layer 212 may be formed on the encapsulant 208, the through vias 206, and the interconnect devices 50. In some embodiments, the dielectric layer 212 is formed of a polymer, such as polybenzoxazole (PBO), polyimide, benzocyclobutene (BCB), or the like. In other embodiments, the dielectric layer 212 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 212 may be formed by any acceptable deposition process, such as spin coating, CVD, laminating, the like, or a combination thereof.

The metallization pattern 214 may be formed on the dielectric layer 212. As an example to form metallization pattern 214, a seed layer is formed over the dielectric layer 212. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 214. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 214.

The dielectric layer 216 may be formed on the metallization pattern 214 and the dielectric layer 212. In some embodiments, the dielectric layer 216 is formed of a polymer, which may be a photo-sensitive material such as PBO, polyimide, BCB, or the like, that may be patterned using a lithography mask. In other embodiments, the dielectric layer 216 is formed of a nitride such as silicon nitride; an oxide such as silicon oxide, PSG, BSG, BPSG; or the like. The dielectric layer 216 may be formed by spin coating, lamination, CVD, the like, or a combination thereof. The dielectric layer 216 may be formed from a material similar to that of the dielectric layer 212, in some embodiments.

It should be appreciated that the third interconnect structure 210 may include any number of dielectric layers and metallization patterns. If more dielectric layers and metallization patterns are to be formed, steps and processes similar to those discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 19:
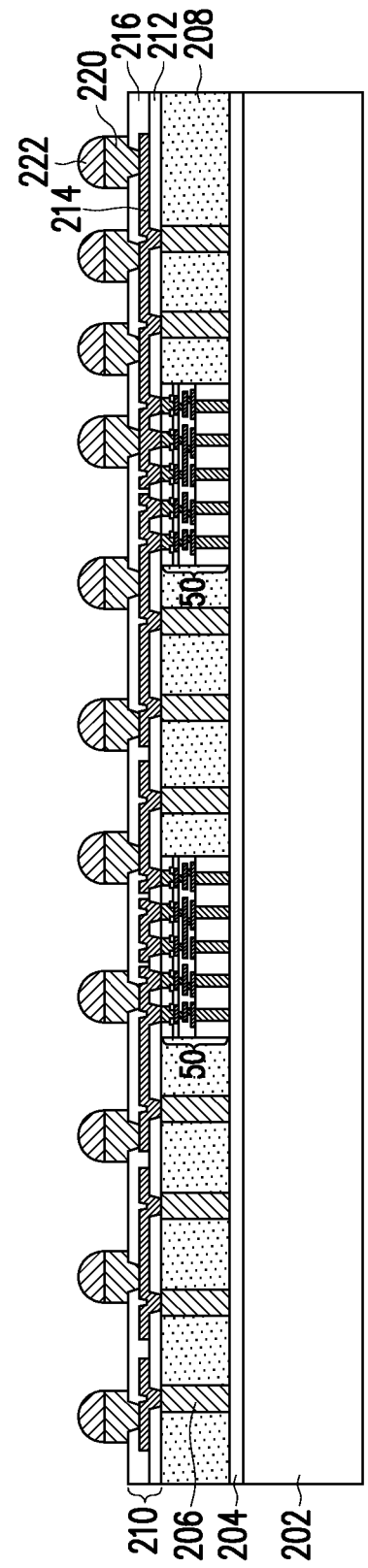

In FIG. 19, under-bump metallizations (UBMs) 220 and conductive connectors 222 are formed for external connection to the third interconnect structure 210, in accordance with some embodiments. In an example of forming the UBMs 220, the dielectric layer 216 is first patterned to form openings exposing portions of the through vias 206 and the conductive connectors 76 of the interconnect devices 50. The patterning may be performed using an acceptable process, such as by exposing the dielectric layer 216 to light when the dielectric layer 216 is a photo-sensitive material or by etching using, for example, an anisotropic etch. If the dielectric layer 216 is a photo-sensitive material, the dielectric layer 216 can be developed after the exposure.

The UBMs 220 have bump portions on and extending along the major surface of the dielectric layer 216, and have via portions extending through the dielectric layer 216 to physically and electrically couple the metallization pattern 214. As a result, the UBMs 220 are electrically coupled to the through vias 206 and the interconnect devices 50. The UBMs 220 may be formed of the same material as the metallization pattern 214, and may be formed using a similar process (e.g., plating). In some embodiments, the UBMs 220 have a different size (e.g., width, thickness, etc.) than the metallization pattern 214.

The conductive connectors 222 are then formed on the UBMs 220, in accordance with some embodiments. The conductive connectors 222 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 222 may include a conductive material such as solder, copper, aluminum, gold, nickel, silver, palladium, tin, the like, or a combination thereof. In some embodiments, the conductive connectors 222 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 222 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 20:
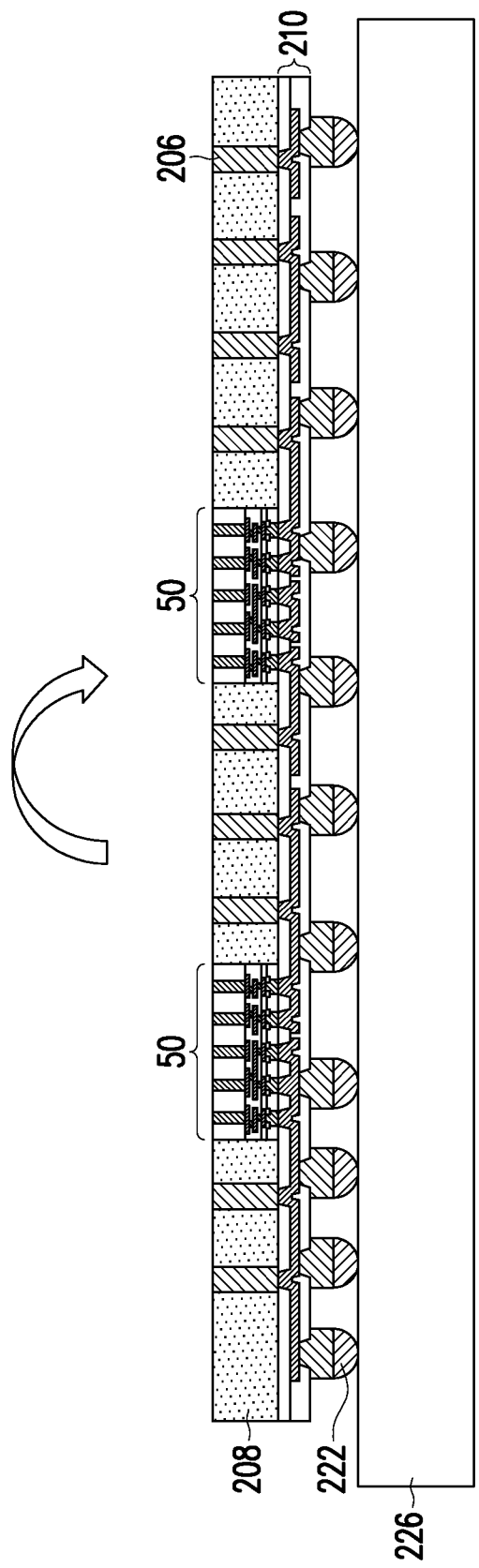

In FIG. 20, a carrier substrate de-bonding is performed to detach (or "de-bond") the first carrier substrate 202 from the structure. In accordance with some embodiments, the de-bonding includes projecting a light such as a laser light or an UV light on the release layer 204 so that the release layer 204 decomposes under the heat of the light and the first carrier substrate 202 can be removed. The structure is then flipped over and attached to a second carrier substrate 226, as shown in FIG. 20. The second carrier substrate 226 may be a glass carrier substrate, a ceramic carrier substrate, a wafer (e.g., a silicon wafer), or the like. An adhesive layer or a release layer (not shown in FIG. 20) may be formed on the second carrier substrate 226 to facilitate the attaching of the structure.

Figure 21:
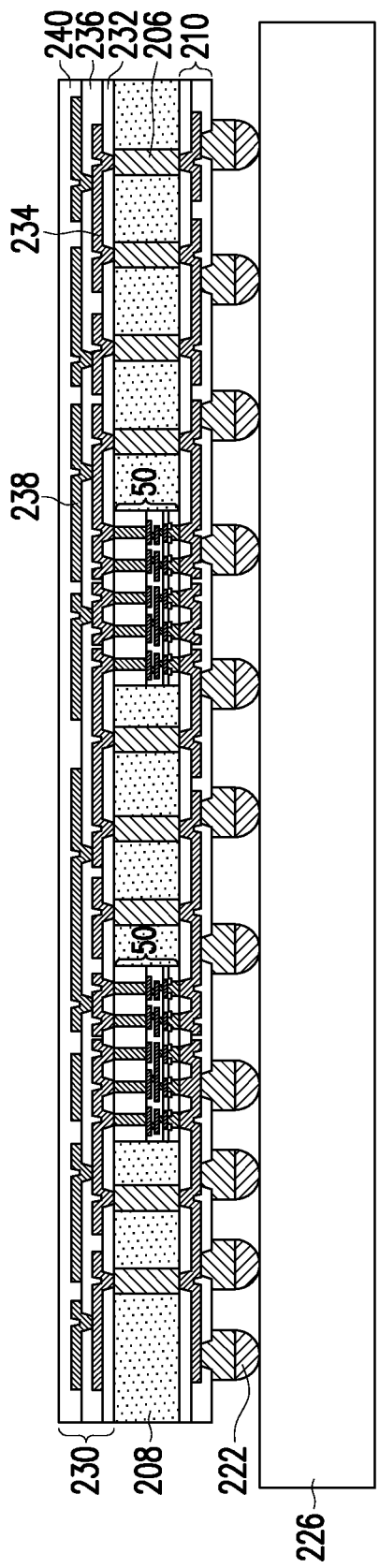

In FIG. 21, a fourth interconnect structure 230 is formed over the encapsulant 208, the through vias 206, and the interconnect devices 50. The fourth interconnect structure 230 includes dielectric layers 232, 236, and 240 and includes metallization patterns 234 and 238. The metallization patterns may also be referred to as redistribution layers or redistribution lines. The fourth interconnect structure 230 is shown as an example having two layers of metallization patterns. More or fewer dielectric layers and metallization patterns may be formed in the fourth interconnect structure 230. If fewer dielectric layers and metallization patterns are to be formed, steps and process discussed below may be omitted. If more dielectric layers and metallization patterns are to be formed, steps and processes discussed below may be repeated.

The dielectric layer 232 is first deposited on the encapsulant 208, the through vias 206, and the interconnect devices 50. In some embodiments, the dielectric layer 232 is formed of a photo-sensitive material such as PBO, polyimide, BCB, or the like, which may be patterned using a lithography mask. The dielectric layer 232 may be formed by spin coating, lamination, CVD, the like, or a combination thereof. The dielectric layer 232 is then patterned. The patterning forms openings exposing portions of the through vias 106 and the TSVs 54 of the interconnect devices 50. The patterning may be by an acceptable process, such as by exposing the dielectric layer 232 to light when the dielectric layer 232 is a photo-sensitive material or by etching using, for example, an anisotropic etch. If the dielectric layer 232 is a photo-sensitive material, the dielectric layer 232 can be developed after the exposure.

The metallization pattern 234 is then formed. The metallization pattern 234 includes line portions (also referred to as conductive lines) on and extending along the major surface of the dielectric layer 232. The metallization pattern 234 further includes via portions (also referred to as conductive vias) extending through the dielectric layer 232 to physically and electrically couple the through vias 206 and the interconnect devices 50. The metallization pattern 234 may be formed in a similar manner and of a similar material as the metallization pattern 214 of the third interconnect structure 210, described previously for FIG. 18.

The dielectric layer 236 is then deposited on the metallization pattern 234 and dielectric layer 232. The dielectric layer 236 may be formed in a manner similar to the dielectric layer 232, and may be formed of a similar material as the dielectric layer 232. The metallization pattern 238 is then formed. The metallization pattern 238 includes line portions on and extending along the major surface of the dielectric layer 236. The metallization pattern 238 further includes via portions extending through the dielectric layer 236 to physically and electrically couple the metallization pattern 234. The metallization pattern 130 may be formed in a similar manner and of a similar material as the metallization pattern 234. The metallization pattern 238 is the topmost metallization pattern of the fourth interconnect structure 230. As such, all of the intermediate metallization patterns of the fourth interconnect structure 230 (e.g., the metallization pattern 234) are disposed between the metallization pattern 238 and the interconnect devices 50. In some embodiments, the metallization pattern 238 has a different size than the metallization pattern 234. For example, the conductive lines and/or vias of the metallization pattern 238 may be wider or thicker than the conductive lines and/or vias of the metallization pattern 234. Further, the metallization pattern 238 may be formed to a greater pitch than the metallization pattern 234.

The dielectric layer 240 is deposited on the metallization pattern 238 and dielectric layer 236. The dielectric layer 240 may be formed in a manner similar to the dielectric layer 232, and may be formed of the same material as the dielectric layer 232. The dielectric layer 240 is the topmost dielectric layer of the fourth interconnect structure 230. As such, all of the metallization patterns of the fourth interconnect structure 230 (e.g., the metallization patterns 234 and 238) are disposed between the dielectric layer 240 and the interconnect devices 50. Further, all of the intermediate dielectric layers of the fourth interconnect structure 230 (e.g., the dielectric layers 232 and 236) are disposed between the dielectric layer 240 and the interconnect devices 50.

Figure 22:
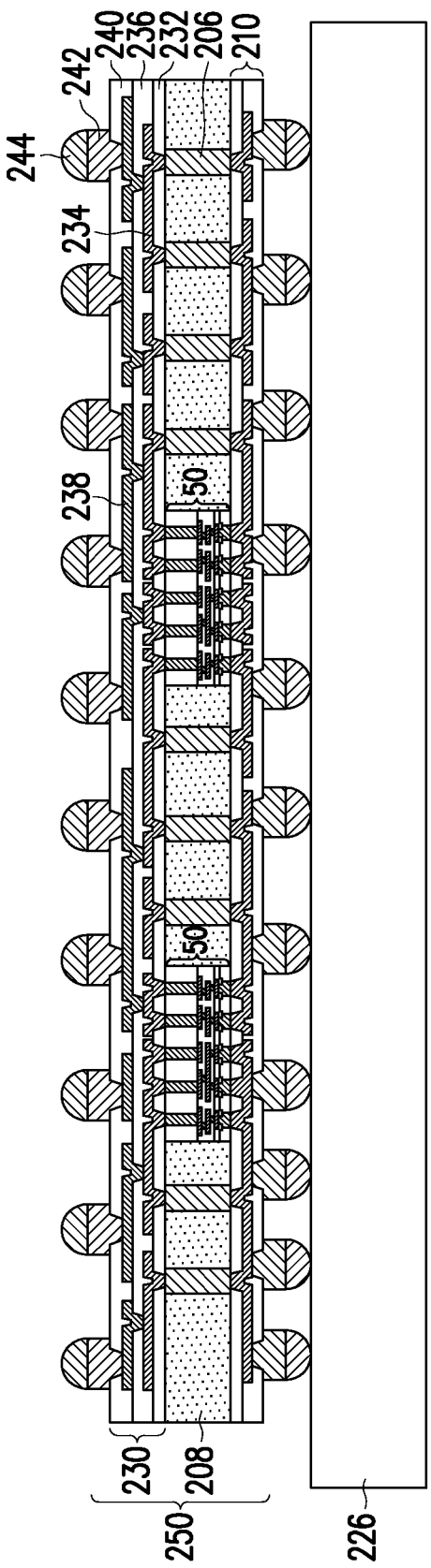

In FIG. 22, UBMs 242 and conductive connectors 244 are formed for external connection to the fourth interconnect structure 230, in accordance with some embodiments. In this manner, an interposer structure 250 may be formed. The UBMs 242 have bump portions on and extending along the major surface of the dielectric layer 240, and have via portions extending through the dielectric layer 240 to physically and electrically couple the metallization pattern 238. The UBMs 242 may be formed of the same material as the metallization pattern 238. In some embodiments, the UBMs 242 have a different size than the metallization patterns 234 or 238.

Conductive connectors 244 may be formed on the UBMs 242. The conductive connectors 244 may be similar to the conductive connectors 222 described previously for FIG. 19. For example, the conductive connectors 244 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 244 may include a conductive material such as solder, copper, aluminum, gold, nickel, silver, palladium, tin, the like, or a combination thereof. In some embodiments, the conductive connectors 244 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 244 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Forming an interposer structure 250 in this manner may achieve advantages. For example, the interposer structure 250 as described herein may be formed having relatively large dimensions, such as having lateral dimensions between about 70 mm by 70 mm and about 150 mm by 150 mm. This can allow for the formation of a photonic system 300 (see FIG. 24) of a correspondingly larger size, allowing for the incorporation of more components, increased processing functionality, more flexibility in design, and/or reduced cost.

The interposer structure 250 allows the incorporation of interconnect devices 50 to provide improved high-speed transmission of electrical signals between components of a photonic system 300 (see FIG. 24), such as between photonic packages 100, processing dies 124, and/or memory dies 126. As such, the interposer structure 250 may be considered a "composite interposer structure." The incorporation of interconnect devices 50 can improve the high-speed operation of the photonic system 300 and reduce power consumption. In some embodiments, electronic devices such as active or passive devices may be incorporated within the interposer structure 250. In some embodiments, the interposer structure 250 may be completely free of active devices. An example electronic device 402 within an interposer structure 250 is described below in FIG. 28.

Figure 23:
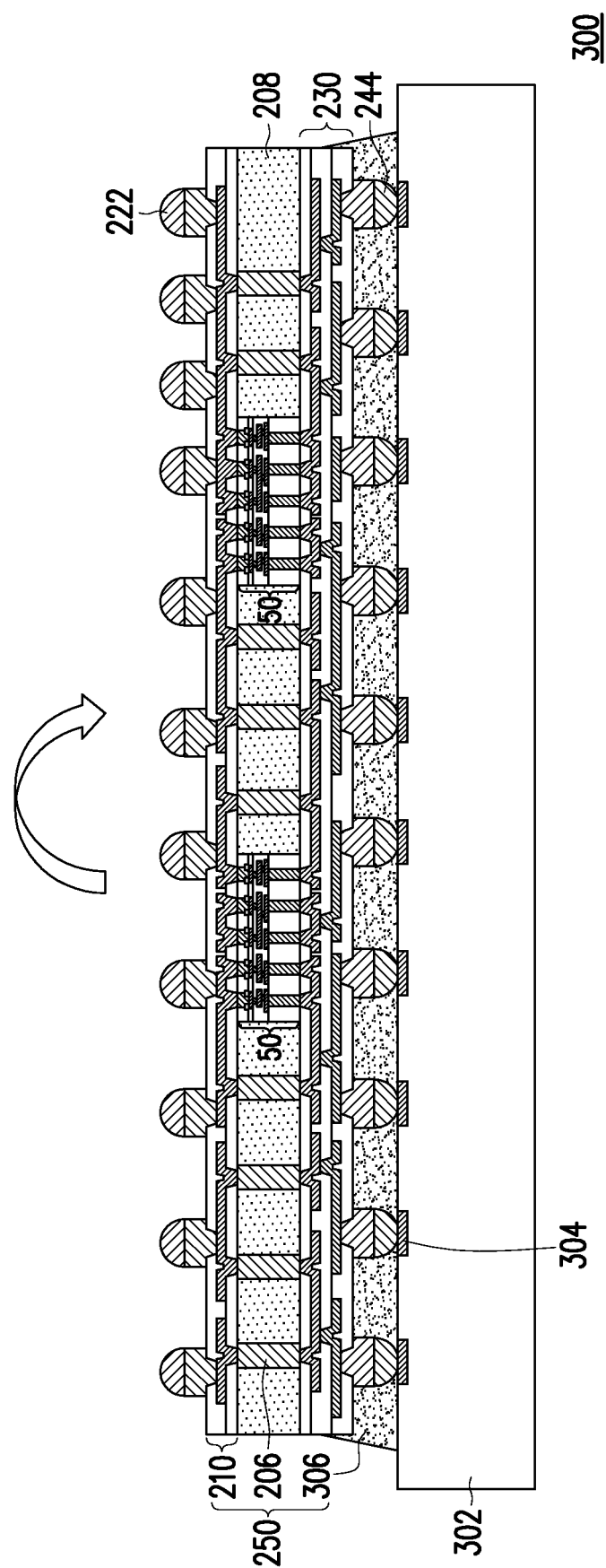
FIGS. 23 and 24 illustrate cross-sectional views of intermediate steps of forming a photonic system, in accordance with some embodiments.
Figure 24:
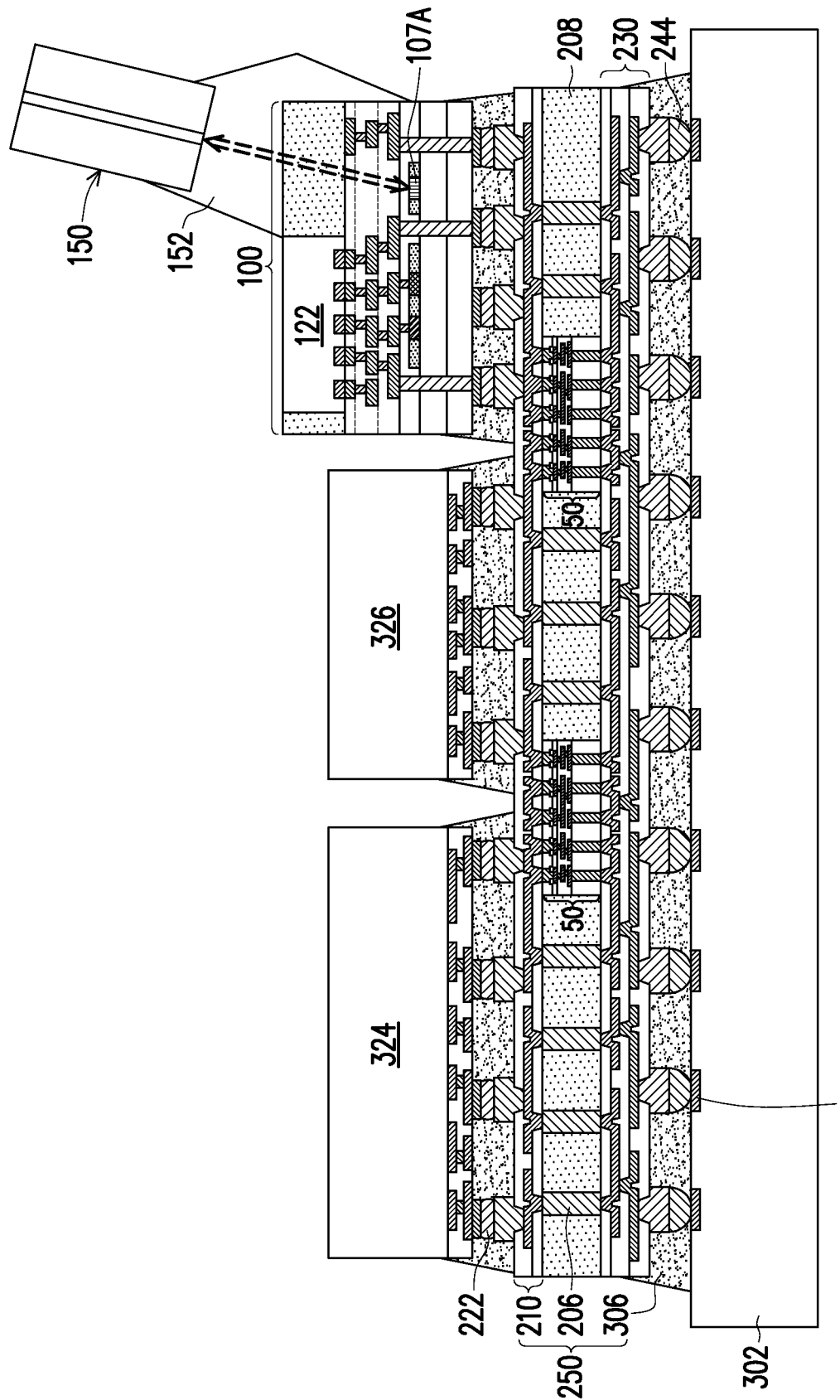

FIGS. 23 and 24 illustrate the formation of a photonic system 300, in accordance with some embodiments. In FIG. 23, the interposer structure 250 is removed from the second carrier substrate 226, flipped over, and attached to an interconnect substrate 302, in accordance with some embodiments. The interconnect substrate 302 may be for example, a glass substrate, a ceramic substrate, a dielectric substrate, an organic substrate (e.g., an organic core), a semiconductor substrate (e.g., a semiconductor wafer), the like, or a combination thereof. In some embodiments, the interconnect substrate 302 includes conductive pads 304 and conductive routing (e.g., conductive lines, vias, redistribution structures, or the like). The interconnect substrate 302 may include passive or active devices, in some embodiments. In some embodiments, the interconnect substrate 302 may be another type of structure, such as an integrated fan-out structure, a redistribution structure, or the like.

The conductive connectors 244 of the interposer structure 250 may be bonded to the conductive pads 304 of the interconnect substrate 302, forming electrical connections between the interposer structure 250 and the interconnect substrate 302. For example, the conductive connectors 244 of the interposer structure 250 may be placed in physical contact with the conductive pads 304 and then a reflow process may be performed to bond solder material of the conductive connectors 244 to the conductive pads 304. In some embodiments, an underfill 306 may be formed between the interposer structure 250 and the interconnect substrate 302.

In FIG. 24, one or more photonic packages 100, processing dies 124, and/or memory dies 126 are attached to the interposer structure 250, forming the photonic system 300, in accordance with some embodiments. A single photonic package 100, processing die 324, and memory die 326 is shown in FIG. 24, but a photonic system 300 may include more than one of these components in any suitable configuration. The photonic package 100 shown in FIG. 24 may be similar to the photonic package 100 described for FIG. 12, in which the photonic package 100 includes a grating coupler 107A. The photonic package 100 may be optically coupled to a vertically mounted optical fiber 150, and thus photonic package 100 may facilitate optical communication between the processing die 324 and external devices, optical networks, or the like. In this manner, a photonic system 300 may combine processing dies 124 and photonic packages 100 on a single interposer structure 250. In some embodiments, a photonic system 300 may include a combination of multiple photonic packages 100 that are coupled to vertically mounted and/or edge mounted optical fibers 150. The optical fiber 150 may be attached using, for example, an optical glue 152.

The photonic system 300 shown in FIG. 24 includes a processing die 324 and a memory die 326, though in other embodiments a photonic system 300 may include more or fewer devices and/or devices of different types than these. The processing die 324 may include, for example, a central processing unit (CPU), a graphics processing unit (GPU), an application-specific integrated circuit (ASIC), a high performance computing (HPC) die, the like, or a combination thereof. The memory die 326 may include, for example, a volatile memory such as dynamic random-access memory (DRAM), static random-access memory (SRAM), another type of memory, or the like. In such embodiments, processing and memory functionality may be integrated within the same die. The processing die 324 and memory die 326 shown are example components, and a photonic system 300 may include one or more semiconductor devices, chips, dies, system-on-chip (SoC) devices, system-on-integrated-circuit (SoIC) devices, the like, or a combination thereof. The processing die 324 and the memory die 326 may have a different arrangement than shown in other embodiments. For example, the processing die 324 may be closer to the photonic package 100 than the memory die 326. These and other configurations are considered within the scope of the present disclosure.

The photonic package 100, the processing die 324, and/or the memory die 326 may be electrically connected to the conductive connectors 222 of the interposer structure 250. The interposer structure 250 electrically connects the photonic package 100, the processing die 324, and/or the memory die 326 and allows transmission of electrical signals between the photonic package 100, the processing die 324, and/or the memory die 326. For example, the photonic package 100, the processing die 324, and/or the memory die 326 may be electrically connected by the interconnect structures 210/230. In some embodiments, the photonic package 100, the processing die 324, and/or the memory die 326 are electrically connected through the interposer structure 250 by the interconnect devices 50. For example, an interconnect device 50 may conduct electrical signals between the processing die 324 and the memory die 326, or an interconnect device 50 may conduct electrical signals between the processing die 324 and the photonic package 100. The use of interconnect devices 50 in this manner allows for improved high-speed communication between the photonic package 100, the processing die 324, and/or the memory die 326. For example, the interconnect devices 50 may have conductive routing of a finer pitch than the conductive routing of the interconnect structures 210/230 or of the interconnect substrate 302, which allows for improved high-speed transmission of electrical signals. The interconnect devices 50 also may be located closer to the photonic package 100, the processing die 324, or the memory die 326 than, for example, the interconnect substrate 302, reducing routing distances and allowing for reduced noise, improved high-speed performance, and reduced power consumption. Multiple interconnect devices 50 may be used in any suitable configuration within the interposer structure 250 of a photonic system 300, allowing for flexible design and the formation of photonic systems 300 of larger size.

In some embodiments, the photonic package 100 of the photonic system 300 receives optical signals from an optical fiber 150 (e.g., at a grating coupler 107A) which are detected using the photodetector 106A of the photonic package 100. The electronic die 122 in the photonic package 100 may then generate corresponding electrical signals based on the optical signals. These electrical signals may then be transmitted to the processing die 324 through an interconnect device 50 of the interposer structure 250. The processing die 324 may then process the electrical signals or provide other appropriate computing functionality. In some embodiments, the processing die 324 generates electrical signals that may be transmitted to the electronic die 122 of the photonic package 100 through an interconnect device 50 of the interposer structure 250. The electronic die 122 may then generate optical signals using a modulator 106B and couple these optical signals into an optical fiber 150 (e.g., using a grating coupler 107A). In some embodiments, the processing die 324 controls the electronic die 122 of the photonic package 100. In this manner, the photonic package 100 may be considered an "optical input/output (I/O) module" for the photonic system 300. Use of photonic packages 100 in this manner may reduce the size or cost of a photonic system 300 while providing high-speed optical communication with external optical components.

Figure 25:
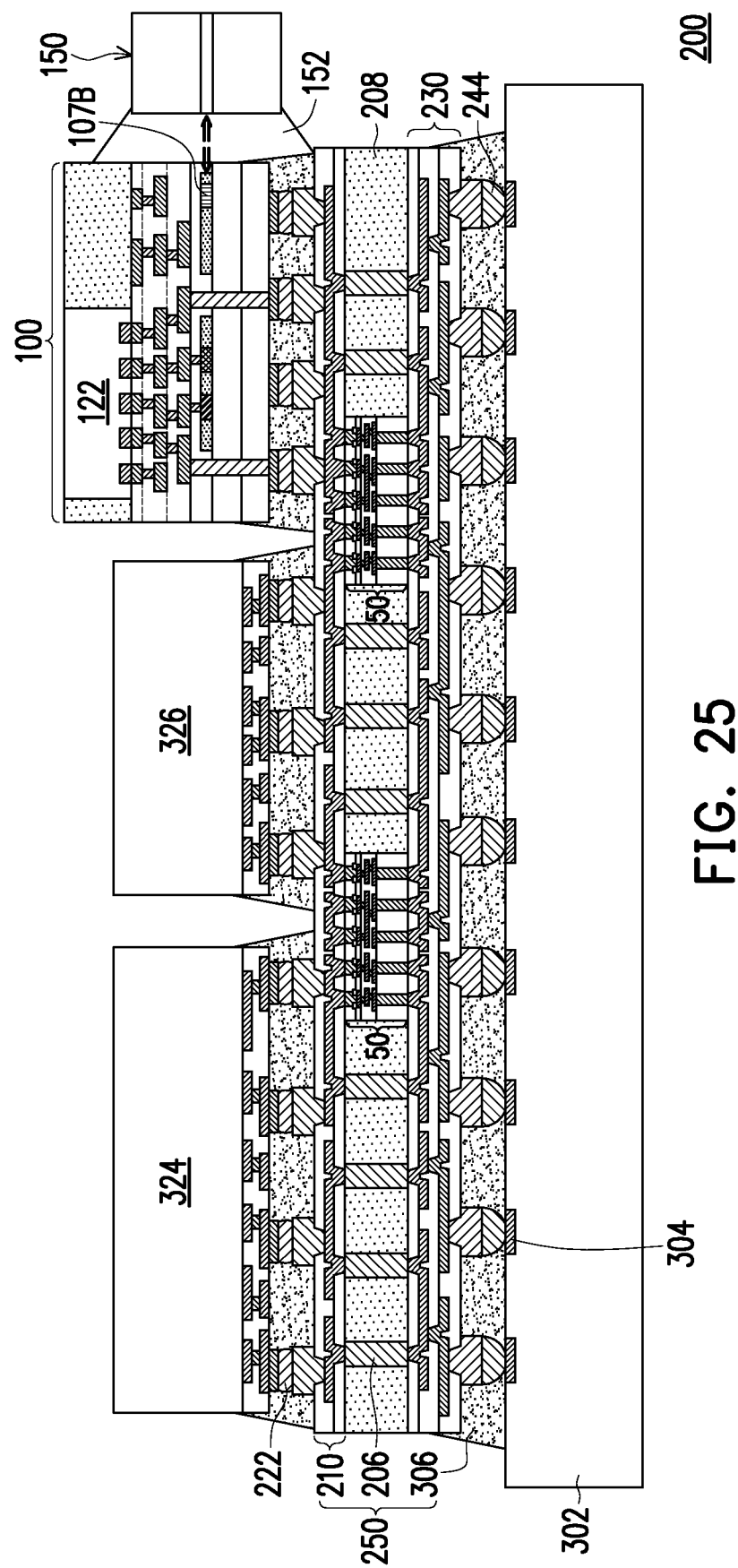
FIG. 25 illustrates a cross-sectional view of a photonic system, in accordance with some embodiments.

FIG. 25 illustrates a photonic system 300 that is coupled to an edge mounted optical fiber 150, in accordance with some embodiments. The photonic system 300 shown in FIG. 25 is similar to the photonic system 300 shown in FIG. 24 or elsewhere herein, except that the photonic package 100 is optically coupled to an edge mounted optical fiber 150. The optical fiber 150 may be attached using, for example, an optical glue 152. The photonic package 100 shown in FIG. 25 is similar to the photonic package 100 described for FIG. 13, in which the photonic package 100 includes an edge coupler 107B. In this manner, a photonic system 300 may include photonic packages 100 configured to be coupled to edge mounted optical fibers 150, vertically mounted optical fibers 150, or a combination thereof.

Figure 26:
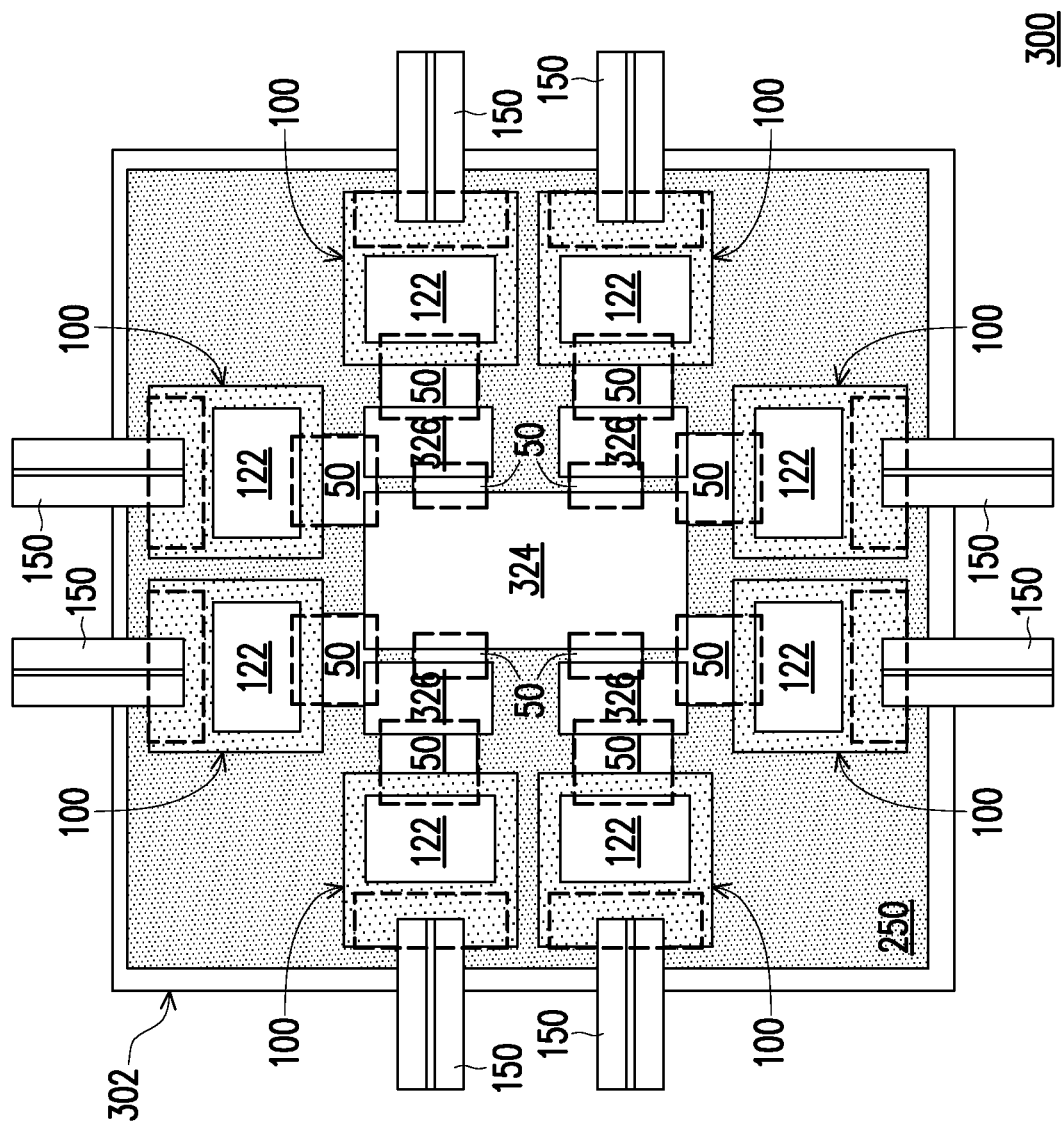
FIG. 26 illustrates a plan view of a photonic system, in accordance with some embodiments.

FIG. 26 shows a plan view of a photonic system 300, in accordance with some embodiments. The photonic system 300 is similar to that shown in FIG. 24 or elsewhere herein, except multiple photonic packages 100 and multiple memory dies 126 are attached to the interposer structure 250. The multiple photonic packages 100 of the photonic system 300 may be electrically connected to the processing die 324 and/or the memory dies 126 through interconnect devices 50 within the interposer structure 250. The multiple memory dies 126 of the photonic system 300 may be electrically connected to the processing die 324 through interconnect devices 50 within the interposer substrate 250. An interconnect device 50 may laterally overlap components that are connected by the interconnect device 50. For example, an interconnect device 50 may laterally overlap a photonic package 100 and a processing die 124 and also interconnect that photonic package and that processing die 124. The interconnect devices 50 may overlap and/or interconnect any two or more components, such as photonic packages 100, processing dies 124, or memory dies 126. The interconnect devices 50 provide high-speed connections between components of the photonic system 300 and thus can improve the high-speed performance of the photonic system 300.

A photonic system 300 as described herein may be configured to communicate using multiple optical fibers 150 and multiple photonic packages 100. A photonic system 300 may include more or fewer photonic packages 100 or memory dies 124, or include multiple processing dies 124, which may be of similar or different types or configurations. The components of the photonic system 300 may also have a different arrangement or configuration than shown in FIG. 26.

Figure 27:
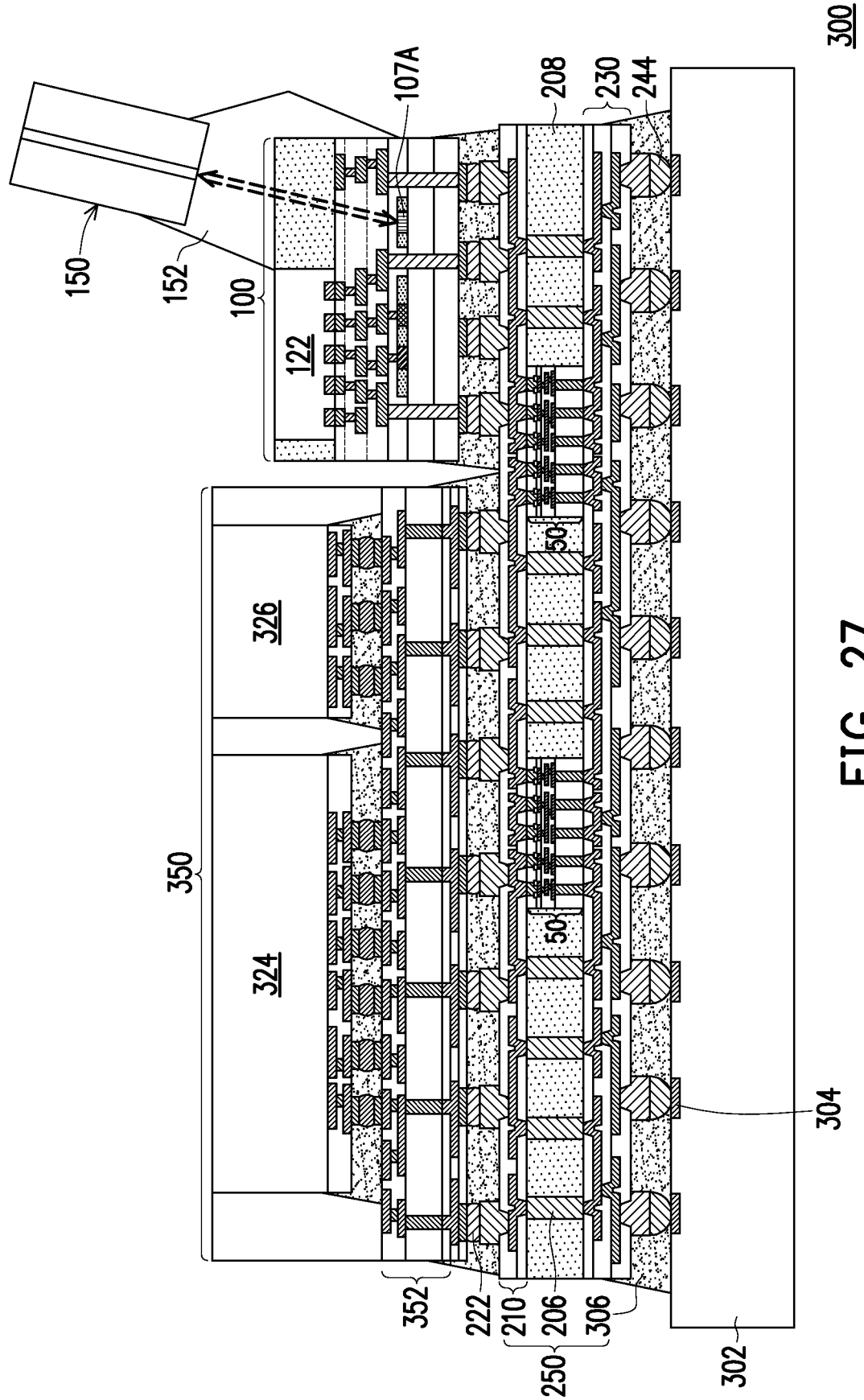
FIG. 27 illustrates a cross-sectional view of a photonic system, in accordance with some embodiments.

FIG. 27 illustrates a photonic system 300 including a computing package 350, in accordance with some embodiments. The photonic system 300 is similar to the photonic system 300 described for FIG. 24 or elsewhere herein, except that the processing die 324 and memory die 326 are connected to an interconnect structure 352 to form a computing package 350. Like reference numerals indicate like elements, which may be formed using like processes. The computing package 350 is attached to the interposer structure 250. The interconnect structure 352 may include conductive routing (e.g., conductive lines, vias, through vias, redistribution layers, or the like) that electrically connects the processing die 324 and the memory die 326. The interconnect structure 352 provides additional electrical routing between the processing die 324 and the memory die 326, and may be considered an interposer in some cases. The computing package 350 may be considered a system-on-chip (SoC) device, a system-on-integrated-circuit (SoIC) device, or the like. Multiple processing dies 124 or multiple memory dies 126 may be attached to the interconnect structure 352 to form the computing package 350. These and other configurations of a computing package 350 are considered within the scope of the present disclosure.

Figure 28:
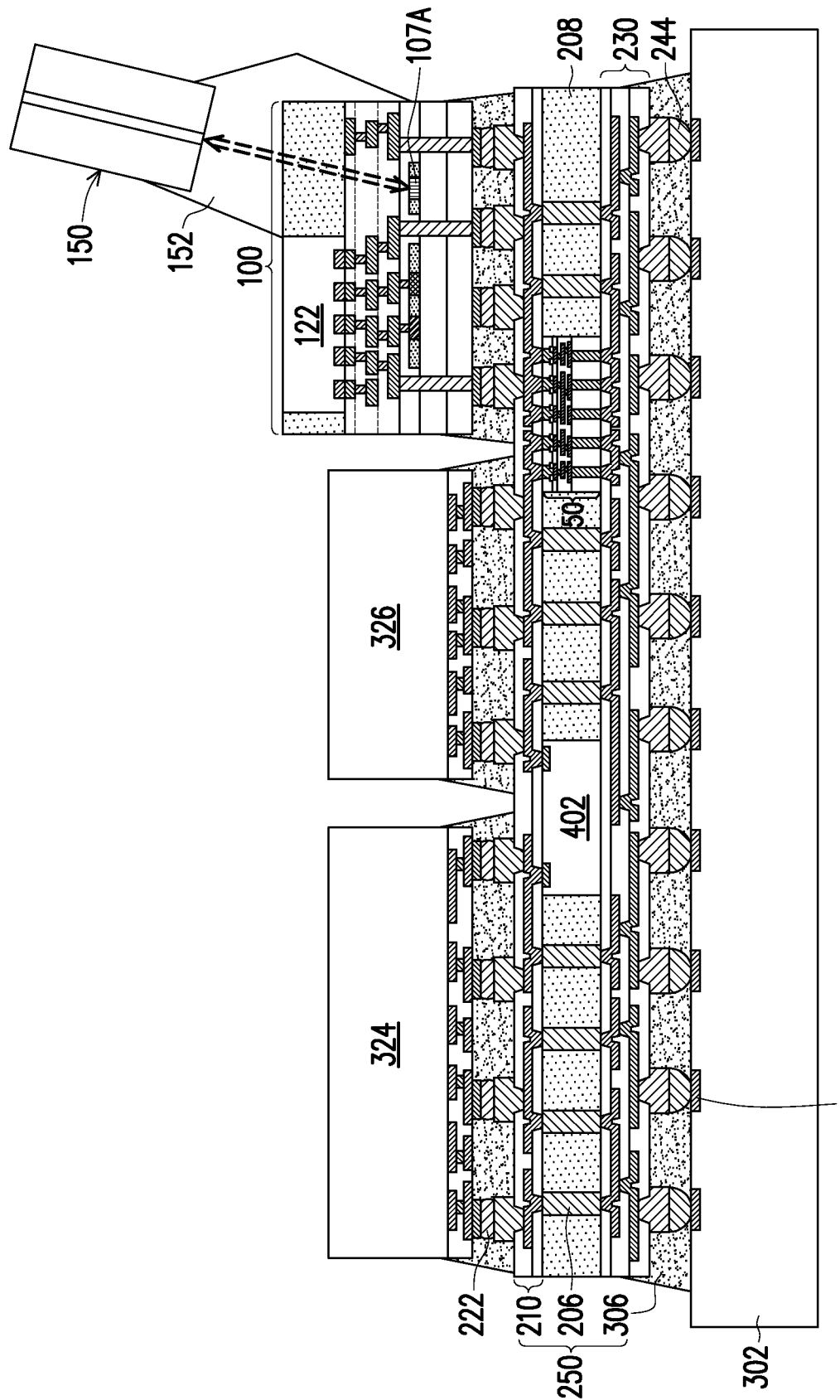
FIG. 28 illustrates a cross-sectional view of a photonic system having an integrated passive device, in accordance with some embodiments.

FIG. 28 illustrates a photonic system 400 that includes an electronic device 402, in accordance with some embodiments. The photonic system 400 is similar to the photonic system 300 shown in FIG. 24 or elsewhere herein, except that an electronic device 402 is incorporated within the interposer structure 250 in addition to an interconnect device 50. Like reference numerals indicate like elements, which may be formed using like processes. Similar to the interconnect devices 50, the electronic device 402 may be electrically connected to one or both of the interconnect structures 210/230 of the interposer structure 250. The electronic device 402 may be incorporated into the interposer structure 250 similarly to the interconnect device 50, such placing the electronic device 402 onto the release layer 204 as described for FIG. 15 and then performing subsequent processing steps similarly. One electronic device 402 is shown in FIG. 28, but multiple electronic devices 402 may be present in other embodiments. The multiple electronic devices may include similar electronic devices 402 and/or different electronic devices 402.

The electronic devices 402 may be, for example, a die (e.g., an integrated circuit die, power integrated circuit die, logic die, or the like), a chip, a semiconductor device, a memory device (e.g., SRAM or the like), a passive device (e.g., an integrated passive device (IPD), a multi-layer ceramic capacitor (MLCC), an integrated voltage regulator (IVR), or the like), the like, or a combination thereof. The electronic device 402 may comprise one or more active devices such as transistors, diodes, or the like and/or one or more passive devices such as capacitors, resistors, inductors, or the like. In this manner, different electronic devices 402 can be implemented in an interposer structure 250, providing additional functionality and performance benefits. For example, by incorporating electronic devices 402 such as IPDs or IVRs that are coupled to the power routing of the photonic system 400, the stability of the power supplied to the photonic packages 100, processing dies 124, and/or memory dies 126 may be improved. In some embodiments, the electronic devices 402 may also provide additional routing between the photonic packages 100, processing dies 124, and/or memory dies 126, similar to that provided by interconnect devices 50.

Embodiments may achieve advantages. The embodiments described herein allow for a photonic system to be formed with less cost, larger size, and improved operation. For example, by bonding electronic dies to a photonic routing structure, an optical fiber may be mounted vertically. This allows for improved optical coupling to an optical fiber for communication with external optical components. The electronic dies are used as an "optical I/O interface" between optical communications components and processing dies of the photonic system. For example, the electronic dies can serve as the optical I/O interface for a CoWoS HPC system formed on the same substrate in a MCM package. In some cases, high speed SerDes devices and may be integrated with photonics device while having flexible and efficient optical fiber attachment, which includes in both vertical or edge optical fiber connections. By having edge surfaces or top surfaces of a photonic device exposed to the atmosphere, signal loss due to optical coupling can be reduced. In some cases, the embodiments described herein may reduce processing costs and reduce the size of a photonic system. In some cases, the use of a single photonic routing structure to optically connect computing sites can allow increased device performance in, e.g., HPC applications that include many interconnected computer systems. Transmitting optical signals between computing sites may have less signal attenuation at high frequencies, lower crosstalk, and less switching noise than transmitting electrical signals with e.g., conductive lines and the like. Optical communication may allow for lower-latency and higher-bandwidth communication between some of the sites.

Embodiments may achieve advantages. The embodiments described herein allow for an optical coupling to a photonic system to be formed with less cost and improved operation. For example, by bonding electronic dies to a waveguide structure, an optical fiber may be mounted vertically. This allows for improved optical coupling to an optical fiber. The electronic dies are used in a photonic package as an "optical I/O interface" between optical communications components and processing dies. For example, the electronic dies can serve as the optical I/O interface for a CoWoS HPC system formed on the same substrate in a MCM package. In some cases, high speed SerDes devices and may be integrated with photonics device while having flexible and efficient optical fiber attachment, which includes in both vertical or edge optical fiber connections. The photonic packages and processing dies are connected to an interposer structure that provides electrical connections between these components. The interposer structure may also include interconnect devices that provide improved high speed electrical connections between these components. When forming the photonic system, photonic packages, electronic dies, processing dies, or the like are connected to the interposer structure near the end of the process, thus allowing testing of the interposer structure prior to connection of these components. This can improve yield and reduce cost of forming a photonic system.

In accordance with an embodiment, a method includes forming a photonic package, wherein forming the photonic package includes patterning a silicon layer to form a waveguide; forming a first interconnect structure over the waveguide; and bonding a first semiconductor die to the first interconnect structure using a dielectric-to-dielectric bonding process; forming an interconnect device, wherein the interconnect device is free of active devices, wherein forming the interconnect device includes forming a routing structure on a first side of a substrate; and forming conductive connectors on and electrically connected to the routing structure; forming an interposer structure, wherein forming the interposer structure includes forming a first via on a first carrier; placing the interconnect device on the first carrier; encapsulating the first via and the interconnect device with an encapsulant; and forming a second interconnect structure on the interconnect device and the first via, wherein the second interconnect structure is electrically connected to the first via and to the conductive connectors of the interconnect device; and bonding the photonic package and a second semiconductor die to the second interconnect structure, wherein the photonic package and the second semiconductor die are electrically connected through the interconnect device to each other. In an embodiment, the method includes bonding a memory die to the second interconnect structure. In an embodiment, forming the photonic package includes forming a photodetector that is optically coupled to the waveguide, wherein the photodetector is electrically connected to the interconnect structure. In an embodiment, forming the photonic package includes patterning the silicon layer to form a grating coupler. In an embodiment, the method includes attaching an optical fiber to the photonic package over the interconnect structure of the photonic package, wherein the optical fiber is optically coupled to the grating coupler. In an embodiment, forming the photonic package includes patterning the silicon layer to form an edge coupler. In an embodiment, the method includes forming a third interconnect structure on a second side of the substrate of the interconnect device, wherein the second side is opposite the first side, and wherein the third interconnect structure is electrically connected to the interconnect device and the first via. In an embodiment, forming the interconnect device includes forming through vias extending through the substrate.

In accordance with an embodiment, a method includes forming vias on a first carrier; placing interconnect devices on the first carrier, wherein each interconnect device is free of active devices, and wherein each interconnect device includes a first interconnect structure on a substrate and through-substrate vias (TSVs) extending through the substrate; encapsulating the vias and the interconnect devices with an encapsulant; forming a second interconnect structure over a first side of the vias, the interconnect devices, and the encapsulant, wherein the second interconnect structure is electrically connected to the vias and to respective first interconnect structures of the interconnect devices; forming conductive connectors on the second interconnect structure, wherein the conductive connectors are connected to the second interconnect structure; bonding a processing die to first conductive connectors of the conductive connectors, wherein the processing die is electrically connected to a first interconnect device of the interconnect devices; and bonding a photonic package to second conductive connectors of the conductive connectors, wherein the photonic package is electrically connected to the first interconnect device of the interconnect devices, and wherein the photonic package includes a waveguide, a photodetector optically coupled to the waveguide, and a semiconductor die electrically connected to the photodetector. In an embodiment, the method includes mounting an optical fiber to a sidewall of the photonic package, wherein the optical fiber is optically coupled to the waveguide. In an embodiment, the method includes mounting an optical fiber to a top surface of the photonic package, wherein the optical fiber is optically coupled to the waveguide.

In accordance with an embodiment, a package includes an interposer structure including a first via; a first interconnect device including conductive routing, wherein the first interconnect device is free of active devices; an encapsulant surrounding the first via and the first interconnect device; and a first interconnect structure over the encapsulant, the first interconnect structure connected to the first via and the first interconnect device; a first semiconductor die bonded to the first interconnect structure, wherein the first semiconductor die is electrically connected to the first interconnect device; and a first photonic package bonded to the first interconnect structure, wherein the first photonic package is electrically connected to the first semiconductor die through the first interconnect device, wherein the first photonic package includes a photonic routing structure including a waveguide on a substrate; a second interconnect structure over the photonic routing structure, the second interconnect structure including conductive features and dielectric layers; and an electronic die bonded to the second interconnect structure, wherein the electronic die is electrically connected to the second interconnect structure. In an embodiment, the first photonic package includes a grating coupler on the substrate; and an optical fiber mounted over the first photonic package, wherein the optical fiber is optically coupled to the grating coupler. In an embodiment, a region of the second interconnect structure between the grating coupler and the optical fiber is free of conductive features. In an embodiment, the dielectric layers of the second interconnect structure are transparent to optical signals transmitted between the grating coupler and the optical fiber. In an embodiment, the interposer structure includes a second interconnect device; and a second photonic package bonded to the first interconnect structure, wherein the second photonic package and the first semiconductor die are electrically connected to the second interconnect device. In an embodiment, the first semiconductor die is connected to the first interconnect structure by an interposer. In an embodiment, the interposer structure includes an integrated passive device (IPD) electrically connected to the first interconnect structure, wherein the IPD is surrounded by the encapsulant. In an embodiment, the first interconnect device laterally overlaps the first semiconductor die and the first photonic package. In an embodiment, the photonic routing structure includes a photonic device, wherein the electronic die is electrically connected to the photonic device through the second interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a photonic package, wherein forming the photonic package comprises:
        patterning a silicon layer to form a waveguide;
        forming a first interconnect structure over the waveguide; and
        bonding a first semiconductor die to the first interconnect structure;
    forming an interconnect device, wherein the interconnect device is free of active devices, wherein forming the interconnect device comprises:
        forming a routing structure on a first side of a substrate; and
        forming conductive connectors on and electrically connected to the routing structure;
    forming an interposer structure, wherein forming the interposer structure comprises:
        forming a first via on a first carrier;
        placing the interconnect device on the first carrier;
        encapsulating the first via and the interconnect device with an encapsulant; and
        forming a second interconnect structure on the interconnect device and the first via, wherein the second interconnect structure is electrically connected to the first via and to the conductive connectors of the interconnect device; and
    bonding the photonic package and a second semiconductor die to the second interconnect structure, wherein the photonic package and the second semiconductor die are electrically connected through the interconnect device to each other.

2. The method of claim 1 further comprising bonding a memory die to the second interconnect structure.

3. The method of claim 1 wherein forming the photonic package further comprises forming a photodetector that is optically coupled to the waveguide, wherein the photodetector is electrically connected to the interconnect structure.

4. The method of claim 1 wherein forming the photonic package further comprises patterning the silicon layer to form a grating coupler.

5. The method of claim 4 further comprising attaching an optical fiber to the photonic package over the interconnect structure of the photonic package, wherein the optical fiber is optically coupled to the grating coupler.

6. The method of claim 1, wherein forming the photonic package further comprises patterning the silicon layer to form an edge coupler.

7. The method of claim 1 further comprising forming a third interconnect structure on a second side of the substrate of the interconnect device, wherein the second side is opposite the first side, and wherein the third interconnect structure is electrically connected to the interconnect device and the first via.

8. The method of claim 1, wherein forming the interconnect device further comprises forming through vias extending through the substrate.

9. The method of claim 1, wherein bonding the first semiconductor die to the first interconnect structure comprises a dielectric-to-dielectric bonding process.

10. A method comprising:
    forming a plurality of vias on a first carrier;
    placing a plurality of interconnect devices on the first carrier, wherein each interconnect device is free of active devices, and wherein each interconnect device comprises a first interconnect structure on a substrate and through-substrate vias (TSVs) extending through the substrate;
    encapsulating the plurality of vias and the plurality of interconnect devices with an encapsulant;
    forming a second interconnect structure over a first side of the plurality of vias, the plurality of interconnect devices, and the encapsulant, wherein the second interconnect structure is electrically connected to the plurality of vias and to respective first interconnect structures of the plurality of interconnect devices;
    forming a plurality of conductive connectors on the second interconnect structure, wherein the conductive connectors are connected to the second interconnect structure;
    bonding a first semiconductor die to first conductive connectors of the plurality of conductive connectors, wherein the first semiconductor die is electrically connected to a first interconnect device of the plurality of interconnect devices; and
    bonding a photonic package to second conductive connectors of the plurality of conductive connectors, wherein the photonic package is electrically connected to the first interconnect device of the plurality of interconnect devices, and wherein the photonic package comprises a waveguide, a photodetector optically coupled to the waveguide, and a second semiconductor die electrically connected to the photodetector.

11. The method of claim 10 further comprising mounting an optical fiber to a sidewall of the photonic package, wherein the optical fiber is optically coupled to the waveguide.

12. The method of claim 10 further comprising mounting an optical fiber to a top surface of the photonic package, wherein the optical fiber is optically coupled to the waveguide.

13. The method of claim 10 further comprising encapsulating the first semiconductor die with a molding material.

14. The method of claim 10 further comprising pacing an integrated passive device on the first carrier.

15. The method of claim 10 further comprising forming a first underfill material under the photonic package and a second underfill material under the first semiconductor die.

16. A method comprising:
   forming a first interconnect structure comprising:
      forming a plurality of vias on a first redistribution structure;
      forming a plurality of interconnect devices on the first interconnect structure, wherein the interconnect devices are free of active devices, wherein each interconnect device respectively comprises a plurality of through-vias in a substrate;
      encapsulating the plurality of vias and the plurality of interconnect devices; and
      forming a second redistribution structure on the plurality of vias and on the plurality of interconnect devices, wherein the second redistribution structure is electrically coupled to the first redistribution structure;
   connecting a photonic device to the second redistribution structure, wherein the photonic device comprises a waveguide; and
   connecting a first semiconductor device to the second redistribution structure adjacent the photonic device.

17. The method of claim 16, wherein the photonic device further comprises a second semiconductor device.

18. The method of claim 16, wherein each interconnect device respectively further comprises a routing structure.

19. The method of claim 16, wherein a first interconnect device of the plurality of interconnect devices is electrically coupled to the photonic device and the first semiconductor device.

20. The method of claim 16 further comprising attaching an optical fiber to the photonic device, wherein the photonic device is optically coupled to the waveguide.

* * * * *